United States Patent
Kaner et al.

(10) Patent No.: US 11,472,158 B2
(45) Date of Patent: *Oct. 18, 2022

(54) CONTINUOUS PRODUCTION OF EXFOLIATED 2D LAYERED MATERIALS BY COMPRESSIVE FLOW

(71) Applicant: The Regents of the University of California, Oakland, CA (US)

(72) Inventors: Richard B. Kaner, Pacific Palisades, CA (US); Emily Phuong Nam Nguyen, Abbotsford (AU); Syed Reza Rizvi, Oshawa (CA)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/109,261

(22) Filed: Dec. 2, 2020

(65) Prior Publication Data

US 2021/0154977 A1 May 27, 2021

Related U.S. Application Data

(63) Continuation of application No. 15/716,706, filed on Sep. 27, 2017, now Pat. No. 10,882,276.

(Continued)

(51) Int. Cl.
*B32B 9/04* (2006.01)
*C01B 21/064* (2006.01)
(Continued)

(52) U.S. Cl.
CPC ............ *B32B 9/041* (2013.01); *B05B 1/02* (2013.01); *B05B 1/044* (2013.01); *B32B 33/00* (2013.01);
(Continued)

(58) Field of Classification Search
CPC  B32B 9/041; B32B 33/00; B05B 1/02; B05B 1/044; C01B 21/0648; C01B 32/19;
(Continued)

(56) References Cited

U.S. PATENT DOCUMENTS

| 4,284,239 A | 8/1981 | Ikeuchi |
| 6,224,004 B1 | 5/2001 | Kato et al. |

(Continued)

FOREIGN PATENT DOCUMENTS

| CN | 103213971 A | 7/2013 |
| CN | 103977870 A | 8/2014 |

(Continued)

OTHER PUBLICATIONS

Second Office Action for Chinese Patent Application No. 201780059878.4, dated Jun. 16, 2021, 13 pages.

(Continued)

*Primary Examiner* — Daniel C. McCracken
(74) *Attorney, Agent, or Firm* — Withrow & Terranova, P.L.L.C.

(57) ABSTRACT

Described herein are methods for continuous production of an exfoliated two-dimensional (2D) material comprising passing a 2D material mixture through a convergent-divergent nozzle, the 2D material mixture comprising a 2D layered material and a compressible fluid. The method of the present disclosure employs physical compression and expansion of a flow of high-pressure gases, leaving the 2D layered material largely defect free to produce an exfoliated 2D layered in a simple, continuous, and environmentally friendly manner.

20 Claims, 18 Drawing Sheets

Related U.S. Application Data

(60) Provisional application No. 62/402,591, filed on Sep. 30, 2016.

(51) Int. Cl.
| | | |
|---|---|---|
| *B05B 1/02* | (2006.01) | |
| *C01B 32/19* | (2017.01) | |
| *B05B 1/04* | (2006.01) | |
| *B32B 33/00* | (2006.01) | |
| *C01G 39/06* | (2006.01) | |
| *C01B 32/225* | (2017.01) | |
| *C01B 21/06* | (2006.01) | |
| *H01J 37/26* | (2006.01) | |

(52) U.S. Cl.
CPC .......... *C01B 21/0648* (2013.01); *C01B 32/19* (2017.08); *C01G 39/06* (2013.01); *C01B 21/06* (2013.01); *C01B 32/225* (2017.08); *C01P 2002/72* (2013.01); *C01P 2002/82* (2013.01); *C01P 2002/84* (2013.01); *C01P 2004/04* (2013.01); *C01P 2004/24* (2013.01); *H01J 37/26* (2013.01)

(58) Field of Classification Search
CPC ..... C01B 21/06; C01B 32/225; C01B 32/194; C01G 39/06; C01P 2002/72; C01P 2002/82; C01P 2002/84; C01P 2004/04; C01P 2004/24; H01J 37/26; C09C 1/42
See application file for complete search history.

(56) References Cited

U.S. PATENT DOCUMENTS

| | | | | |
|---|---|---|---|---|
| 7,105,108 | B2 | 9/2006 | Kaschak et al. | |
| 7,785,492 | B1* | 8/2010 | Jang | C01B 32/19 |
| | | | | 252/378 R |
| 8,414,799 | B2 | 4/2013 | Pu et al. | |
| 8,696,938 | B2 | 4/2014 | Zhamu et al. | |
| 9,095,858 | B2 | 8/2015 | Fukanuma | |
| 10,882,276 | B2* | 1/2021 | Kaner | B32B 33/00 |
| 2002/0054995 | A1* | 5/2002 | Mazurkiewicz | C08L 33/04 |
| | | | | 428/364 |
| 2003/0203989 | A1 | 10/2003 | Rao et al. | |
| 2005/0037209 | A1 | 2/2005 | Tsapatsis et al. | |
| 2005/0214474 | A1 | 9/2005 | Han et al. | |
| 2009/0155578 | A1 | 6/2009 | Zhamu et al. | |
| 2010/0074835 | A1 | 3/2010 | Mercur | |
| 2010/0193600 | A1 | 8/2010 | Di Loreto | |
| 2010/0222482 | A1 | 9/2010 | Jang et al. | |
| 2011/0037033 | A1 | 2/2011 | Green et al. | |
| 2013/0136684 | A1 | 5/2013 | Wu et al. | |
| 2016/0009561 | A1 | 1/2016 | Coleman et al. | |
| 2016/0194207 | A1 | 7/2016 | Bassani et al. | |
| 2018/0009667 | A1 | 1/2018 | Fan et al. | |
| 2018/0093454 | A1 | 4/2018 | Kaner et al. | |

FOREIGN PATENT DOCUMENTS

| | | |
|---|---|---|
| CN | 105263858 A | 1/2016 |
| JP | 2014104405 A | 6/2014 |
| JP | 2019033025 A | 2/2019 |
| KR | 0137839 B1 | 6/1998 |
| KR | 101378734 B1 | 4/2014 |
| KR | 20170043350 A | 4/2017 |
| WO | 2014140324 A1 | 9/2014 |
| WO | 2015015120 A1 | 2/2015 |
| WO | 2015114357 A2 | 8/2015 |
| WO | 2020074698 A1 | 4/2020 |

OTHER PUBLICATIONS

Pu, Nen-Wen, et al., "Production of few-layer graphene by supercritical CO2 exfoliation of graphite," Materials Letters, vol. 63, Jun. 22, 2009 Elsevier B.V., 3 pages.
International Search Report and Written Opinion for International Patent Application No. PCT/US2017/053691, dated Nov. 29, 2017, 10 pages.
Non-Final Office Action for U.S. Appl. No. 15/716,706, dated Jan. 15, 2020, 12 pages.
Notice of Allowance for U.S. Appl. No. 15/716,706, dated Sep. 17, 2020, 9 pages.
Extended European Search Report for European Patent Application No. 17857322.6, dated May 19, 2020, 7 pages.
Examination Report for Indian Patent Application No. 201917009354, dated Oct. 29, 2020, 6 pages.
The First Office Action for Chinese Patent Application No. 201780059878.4, dated Jul. 28, 2020, 14 pages.
International Preliminary Report on Patentability for International Patent Application No. PCT/US2017/053691, dated Apr. 11, 2019, 9 pages.
Examination Report for Australian Patent Application No. 2017335685, dated Sep. 6, 2021, 3 pages.
Notification of Reasons for Rejection for Japanese Patent Application No. 2019-516104, dated Sep. 27, 2021, 11 pages.
Examination Report for Taiwanese Patent Application No. 106133708, dated Jan. 27, 2021, 9 pages.
Third Office Action for Chinese Patent Application No. 2017800598784, dated Nov. 10, 2021, 9 pages.
Office Action for Israeli Patent Application No. 265404, dated Dec. 14, 2021, 6 pages.
Preliminary Rejection for Korean Patent Application No. 10-2019-7009316, dated Feb. 17, 2022, 4 pages.
Decision of Rejection for Chinese Patent Application No. 2017800598784, dated May 7, 2022, 9 pages.
Decision to Grant for Japanese Patent Application No. 2019-516104, dated May 27, 2022, 5 pages.

* cited by examiner 200-400  400-600  600-1000  1000-1600 m/s 200-400  400-600  600-1000  1000-1600 m/s

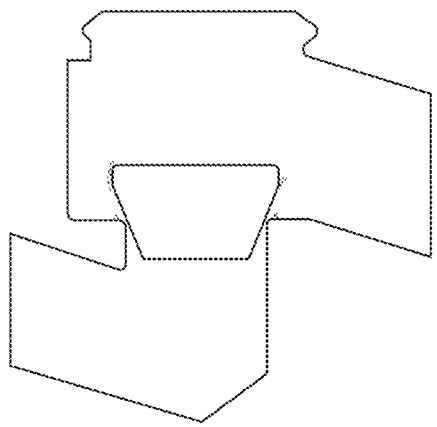
FIG. 8A
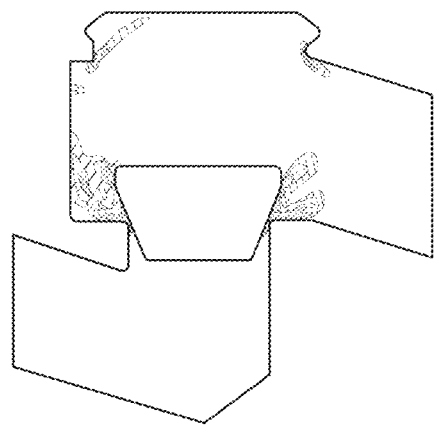
FIG. 8B
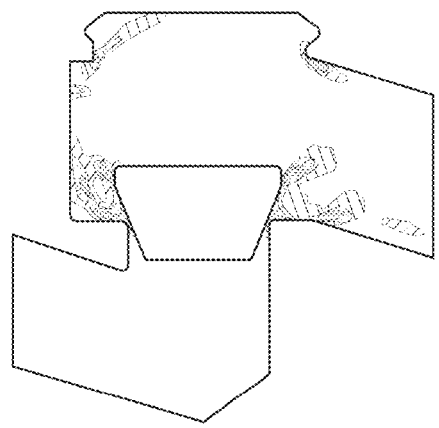
FIG. 8C
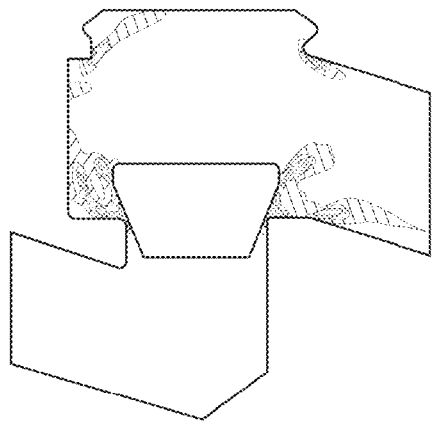
FIG. 8D
0.1-0.3   0.3-0.5   0.5-0.7   0.7-0.9 x $10^5$ ($s^{-1}$)

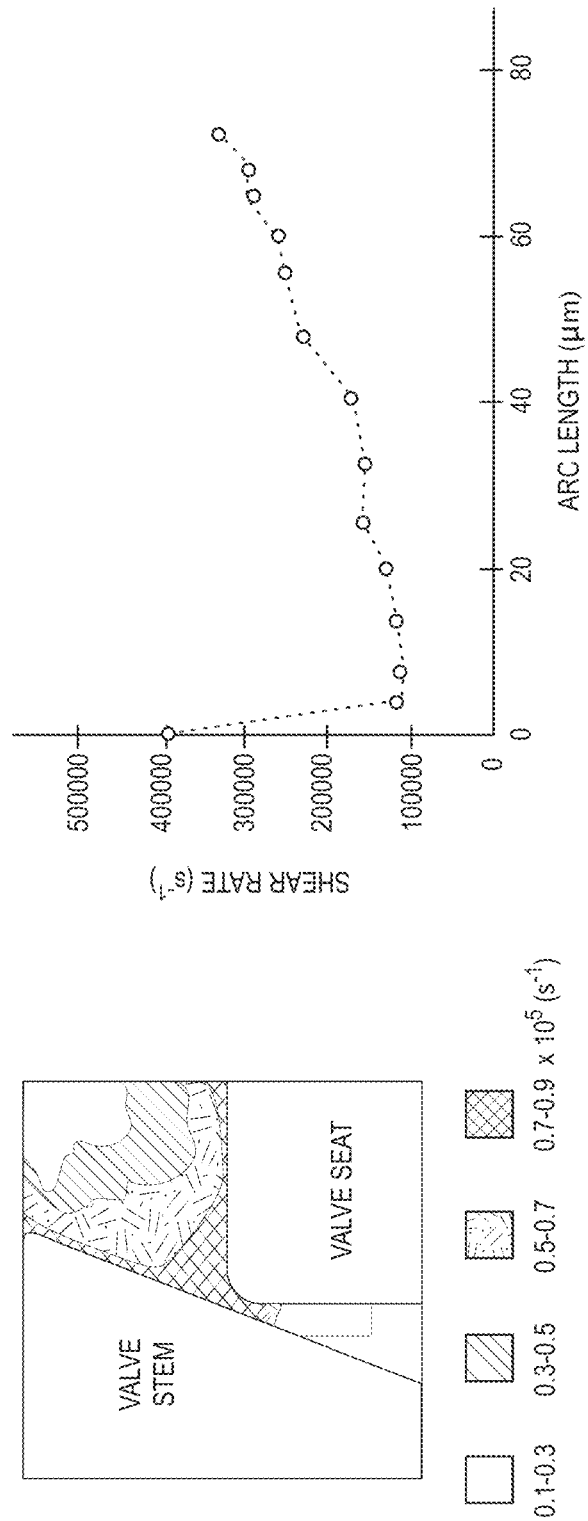

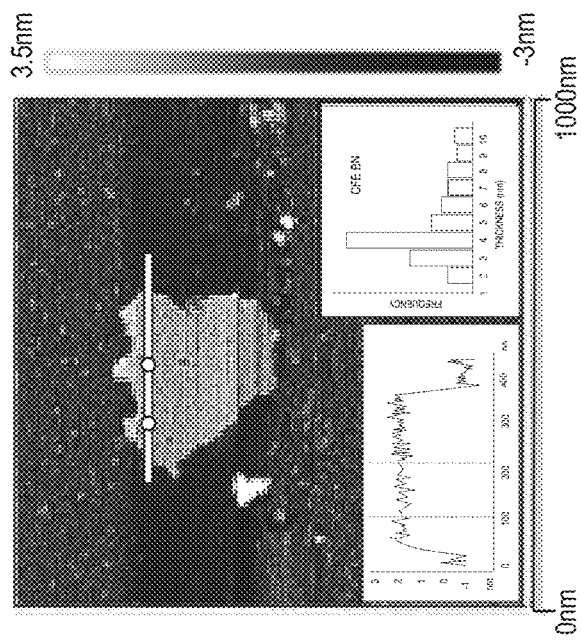
FIG. 13A
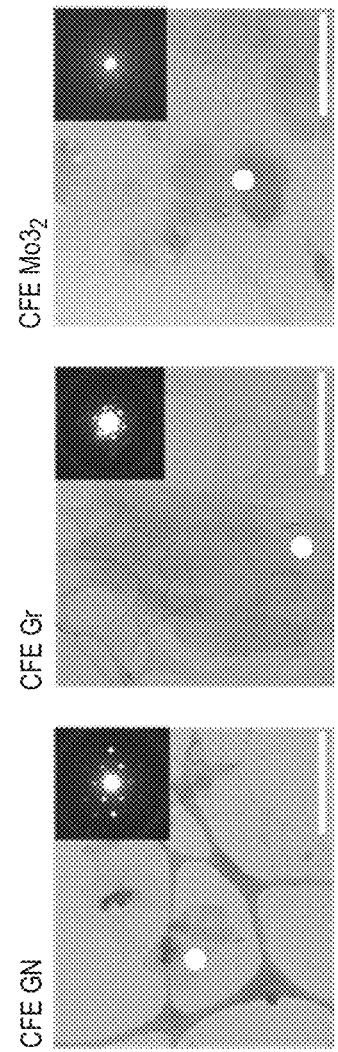
FIG. 13B
FIG. 13C
FIG. 13D

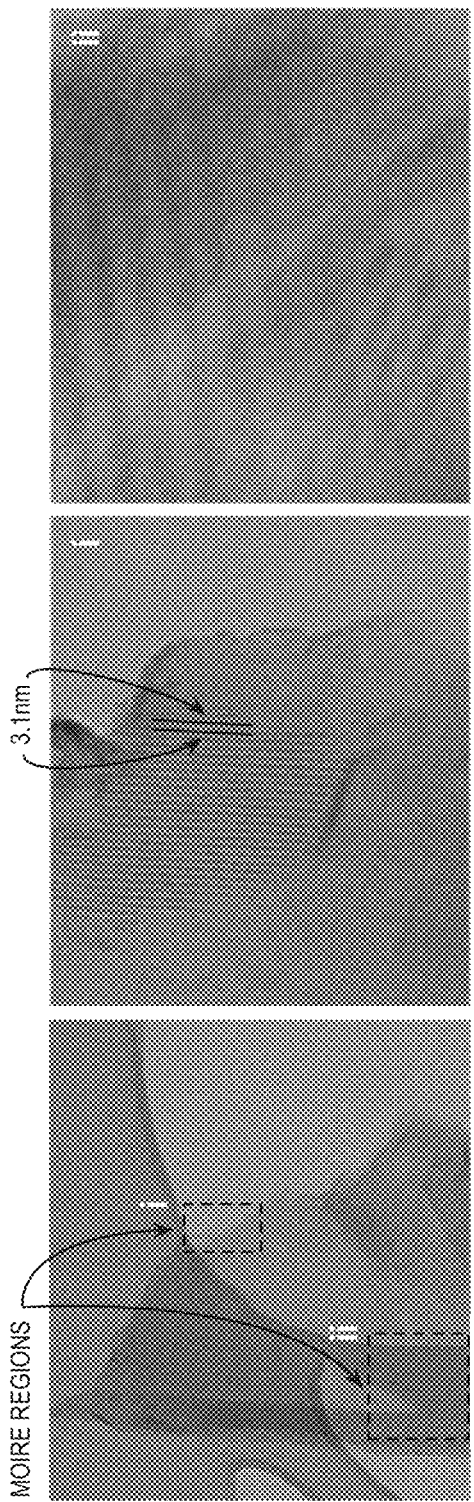

CONTINUOUS PRODUCTION OF EXFOLIATED 2D LAYERED MATERIALS BY COMPRESSIVE FLOW

CROSS-REFERENCE

This application is a continuation of U.S. patent application Ser. No. 15/716,706, filed Sep. 27, 2017, now U.S. Pat. No. 10,882,276, which claims the benefit of U.S. Provisional Application No. 62/402,591, filed Sep. 30, 2016, which application is incorporated herein by reference.

COPYRIGHT STATEMENT

A portion of the disclosure of this patent document contains material that is subject to copyright protection. The copyright owner has no objection to the facsimile reproduction by anyone of the patent document or the patent disclosure as it appears in the U.S. Patent and Trademark Office patent file or records, but otherwise reserves all copyright rights whatsoever.

BACKGROUND

During the last decade, there has been a significant interest in producing single-layer two-dimensional (2D) layered materials. Depending on their chemical structure, single-sheet layered materials possess many beneficial properties, such as high mechanical strength, high electronic and thermal conductivity, unique quantum-mechanical effects, and a high surface area, which are useful in catalysis and energy storage, among other uses. Unlike other, harsher methods for the exfoliation of 2D layered materials, such as chemical intercalation or sonication, the method of the present disclosure relies only on the physical compression and expansion of a flow of high-pressure gases, thus leaving the 2D layered material largely defect free. The exfoliated 2D layered material is produced in a simple, continuous, and environmentally friendly manner. The method of the present disclosure provides an ample and cheap supply of exfoliated 2D layered materials, which opens the way for their mass proliferation and further application development.

Two-dimensional (2D) nanomaterials have numerous applications in next-generation electronics, consumer goods, energy generation and storage, and healthcare. The rapid rise of the utility and applications of 2D nanomaterials necessitates developing a means for mass production. The field of 2D and layered materials has gained significant interest over the last few decades due to the various unique properties that manifest when the bulk material is isolated to its 2D form. Such layered materials comprise graphene, transitional metal dichalcogenides (such as molybdenum disulfide [$MoS_2$] and tungsten disulfide [$WS_2$]) and boron nitrides, the unique properties of which include high mechanical strengths, high electrical and thermal conductivities, high surface areas, and exotic quantum-mechanical effects. However, these properties often depend on the lattice structure, the quality of the material, and the number of isolated layers. As such, the past decade has seen tremendous research efforts on numerous methods to synthesize and exfoliate high-quality 2D materials, while optimizing yields and reducing costs and processing times.

The research and development of 2D layered materials such as graphite, boron nitride, and $MoS_2$ for applications in next-generation electronics, consumer goods, energy generation and storage, and healthcare is widespread and thus necessitates developing a means for the mass production of single-layer 2D materials

SUMMARY

Disclosed herein are continuous flow exfoliation (CFE) methods for exfoliating two-dimensional (2D) nanomaterials using a multiphase flow of 2D layered materials suspended in a high-pressure gas undergoing isentropic expansion. In some embodiments, the expanded gas is sprayed in a solvent, where a significant portion (up to 20%) of the initial material is exfoliated to a few layers per particle. The exfoliation is attributed to the high shear rates ($\dot{\gamma} > 10^5$ s$^{-1}$) experienced by the 2D layered materials in narrow channels and in the presence of rapid isentropic expansion of compressible gases. In some embodiments, the methods described herein have significant benefits over the existing 2D material exfoliation methods, such as regarding chemical intercalation and exfoliation, and liquid phase shear exfoliation, with the most obvious being the fast, continuous nature of the process. Other advantages include environmentally friendly processing, reduced occurrence of defects, and the versatility to be applied to any 2D layered material using any gaseous medium. Scaling this process to industrial production has a strong possibility of reducing the market prices of exfoliated 2D nanomaterials by an order of magnitude.

The methods provided herein relate to batch processing and involve supercritical fluids. The methods of the present disclosure are not limited by these factors; instead, the methods rely on a high-pressure flow, making them suitable for continuous operation, and they may involve any compressible fluid.

Methods are provided herein for continuous flow exfoliation and for exfoliating 2D layered materials by high-speed compressible fluids flowing through fine nozzles and orifices in a continuous manner. The underlying principle is based on accelerating multiphase flows of 2D layered materials suspended in a compressible medium to transonic and supersonic velocities whereby sufficient shear rates ($\dot{\gamma} > 10^5$ s$^{-1}$) are generated to cause layer reduction and exfoliation. Furthermore, the presence of shock waves and low pressures at the flow exist also to assist with layer reduction and exfoliation. Using helium gas and boron nitride particles, the CFE process forms suspensions of 2D nanomaterials in isopropanol that have an average thickness of 4.2 nanometers (nm) and an average length of 276 nm and an average aspect ratio of about 65. The CFE processes taught herein are capable of exfoliating other 2D nanomaterials such as graphene and molybdenum sulfide using a multitude of gases such as helium, nitrogen, and carbon dioxide. Apart from the high concentrations (0.2 milligrams per milliliter [mg/mL]) achieved in a short duration, the advantages of CFE include the ability to isolate the exfoliation and suspension stabilization processes from each other, environmentally friendly processing, and reduced occurrence of defects that might otherwise arise in comparable ultrasound time-based treatment. Using the continuous flow of compressible gases for high-throughput 2D nanomaterials production represents a paradigm shift in economically feasible mass manufacturing with the potential to lower costs by one order of magnitude or more.

One aspect provided herein is a method for continuous production of an exfoliated 2D material comprising passing a 2D material mixture through a convergent-divergent nozzle, the 2D material mixture comprising a 2D layered material and a compressible fluid.

In some embodiments, the 2D layered material comprises graphite, graphene, boron nitride, single-layer boron nitride, molybdenum disulfide ($MoS_2$), single-layer $MoS_2$, or any combination thereof. In some embodiments, the compressible fluid comprises air, nitrogen, carbon dioxide, helium, or any combination thereof.

In some embodiments, the concentration of the 2D layered material in the 2D material mixture is about 0.01 mg/mL to about 0.4 mg/mL. In some embodiments, the concentration of the 2D layered material in the 2D material mixture is at least about 0.01 mg/mL. In some embodiments, the concentration of the 2D layered material in the 2D material mixture is at most about 0.4 mg/mL. In some embodiments, the concentration of the 2D layered material in the 2D material mixture is about 0.01 mg/mL to about 0.02 mg/mL, about 0.01 mg/mL to about 0.05 mg/mL, about 0.01 mg/mL to about 0.1 mg/mL, about 0.01 mg/mL to about 0.15 mg/mL, about 0.01 mg/mL to about 0.2 mg/mL, about 0.01 mg/mL to about 0.25 mg/mL, about 0.01 mg/mL to about 0.3 mg/mL, about 0.01 mg/mL to about 0.35 mg/mL, about 0.01 mg/mL to about 0.4 mg/mL, about 0.02 mg/mL to about 0.05 mg/mL, about 0.02 mg/mL to about 0.1 mg/mL, about 0.02 mg/mL to about 0.15 mg/mL, about 0.02 mg/mL to about 0.2 mg/mL, about 0.02 mg/mL to about 0.25 mg/mL, about 0.02 mg/mL to about 0.3 mg/mL, about 0.02 mg/mL to about 0.35 mg/mL, about 0.02 mg/mL to about 0.4 mg/mL, about 0.05 mg/mL to about 0.1 mg/mL, about 0.05 mg/mL to about 0.15 mg/mL, about 0.05 mg/mL to about 0.2 mg/mL, about 0.05 mg/mL to about 0.25 mg/mL, about 0.05 mg/mL to about 0.3 mg/mL, about 0.05 mg/mL to about 0.35 mg/mL, about 0.05 mg/mL to about 0.4 mg/mL, about 0.1 mg/mL to about 0.15 mg/mL, about 0.1 mg/mL to about 0.2 mg/mL, about 0.1 mg/mL to about 0.25 mg/mL, about 0.1 mg/mL to about 0.3 mg/mL, about 0.1 mg/mL to about 0.35 mg/mL, about 0.1 mg/mL to about 0.4 mg/mL, about 0.15 mg/mL to about 0.2 mg/mL, about 0.15 mg/mL to about 0.25 mg/mL, about 0.15 mg/mL to about 0.3 mg/mL, about 0.15 mg/mL to about 0.35 mg/mL, about 0.15 mg/mL to about 0.4 mg/mL, about 0.2 mg/mL to about 0.25 mg/mL, about 0.2 mg/mL to about 0.3 mg/mL, about 0.2 mg/mL to about 0.35 mg/mL, about 0.2 mg/mL to about 0.4 mg/mL, about 0.25 mg/mL to about 0.3 mg/mL, about 0.25 mg/mL to about 0.35 mg/mL, about 0.25 mg/mL to about 0.4 mg/mL, about 0.3 mg/mL to about 0.35 mg/mL, about 0.3 mg/mL to about 0.4 mg/mL, or about 0.35 mg/mL to about 0.4 mg/mL. In some embodiments, the concentration of the 2D layered material in the 2D material mixture is about 0.01 mg/mL, about 0.02 mg/mL, about 0.05 mg/mL, about 0.1 mg/mL, about 0.15 mg/mL, about 0.2 mg/mL, about 0.25 mg/mL, about 0.3 mg/mL, about 0.35 mg/mL, or about 0.4 mg/mL.

In some embodiments, the convergent-divergent nozzle comprises a de Laval nozzle, a valve, an orifice, a thin tube, or any combination thereof. In some embodiments, the valve comprises a needle valve, a butterfly valve, a globe valve, a pinch valve, an adjustable flow valve, a one-way flow valve, or any combination thereof. In some embodiments, the 2D material mixture enters the convergent-divergent nozzle at a velocity less than the speed of sound in the compressible fluid. In some embodiments, the 2D material mixture exits the convergent-divergent nozzle at a velocity greater than the speed of sound in the compressible fluid. In some embodiments, the exfoliated 2D material comprises a plurality of flakes comprising at most about 20 layers. In some embodiments, the 2D material mixture further comprises a solvent.

In some embodiments, passing the 2D material mixture through the convergent-divergent nozzle comprises applying a pressure to the 2D material mixture of about 200 pounds per square inch (psi) to about 4,000 psi. In some embodiments, passing the 2D material mixture through the convergent-divergent nozzle comprises applying a pressure to the 2D material mixture of at least about 200 psi. In some embodiments, passing the 2D material mixture through the convergent-divergent nozzle comprises applying a pressure to the 2D material mixture of at most about 4,000 psi. In some embodiments, passing the 2D material mixture through the convergent-divergent nozzle comprises applying a pressure to the 2D material mixture of about 200 psi to about 300 psi, about 200 psi to about 400 psi, about 200 psi to about 500 psi, about 200 psi to about 750 psi, about 200 psi to about 1,000 psi, about 200 psi to about 1,500 psi, about 200 psi to about 2,000 psi, about 200 psi to about 2,500 psi, about 200 psi to about 3,000 psi, about 200 psi to about 3,500 psi, about 200 psi to about 4,000 psi, about 300 psi to about 400 psi, about 300 psi to about 500 psi, about 300 psi to about 750 psi, about 300 psi to about 1,000 psi, about 300 psi to about 1,500 psi, about 300 psi to about 2,000 psi, about 300 psi to about 2,500 psi, about 300 psi to about 3,000 psi, about 300 psi to about 3,500 psi, about 300 psi to about 4,000 psi, about 400 psi to about 500 psi, about 400 psi to about 750 psi, about 400 psi to about 1,000 psi, about 400 psi to about 1,500 psi, about 400 psi to about 2,000 psi, about 400 psi to about 2,500 psi, about 400 psi to about 3,000 psi, about 400 psi to about 3,500 psi, about 400 psi to about 4,000 psi, about 500 psi to about 750 psi, about 500 psi to about 1,000 psi, about 500 psi to about 1,500 psi, about 500 psi to about 2,000 psi, about 500 psi to about 2,500 psi, about 500 psi to about 3,000 psi, about 500 psi to about 3,500 psi, about 500 psi to about 4,000 psi, about 750 psi to about 1,000 psi, about 750 psi to about 1,500 psi, about 750 psi to about 2,000 psi, about 750 psi to about 2,500 psi, about 750 psi to about 3,000 psi, about 750 psi to about 3,500 psi, about 750 psi to about 4,000 psi, about 1,000 psi to about 1,500 psi, about 1,000 psi to about 2,000 psi, about 1,000 psi to about 2,500 psi, about 1,000 psi to about 3,000 psi, about 1,000 psi to about 3,500 psi, about 1,000 psi to about 4,000 psi, about 1,500 psi to about 2,000 psi, about 1,500 psi to about 2,500 psi, about 1,500 psi to about 3,000 psi, about 1,500 psi to about 3,500 psi, about 1,500 psi to about 4,000 psi, about 2,000 psi to about 2,500 psi, about 2,000 psi to about 3,000 psi, about 2,000 psi to about 3,500 psi, about 2,000 psi to about 4,000 psi, about 2,500 psi to about 3,000 psi, about 2,500 psi to about 3,500 psi, about 2,500 psi to about 4,000 psi, about 3,000 psi to about 3,500 psi, about 3,000 psi to about 4,000 psi, or about 3,500 psi to about 4,000 psi. In some embodiments, passing the 2D material mixture through the convergent-divergent nozzle comprises applying a pressure to the 2D material mixture of about 200 psi, about 300 psi, about 400 psi, about 500 psi, about 750 psi, about 1,000 psi, about 1,500 psi, about 2,000 psi, about 2,500 psi, about 3,000 psi, about 3,500 psi, or about 4,000 psi.

In some embodiments, the convergent-divergent nozzle has a throat dimension of about 0.005 millimeters (mm) to about 0.5 mm. In some embodiments, the convergent-divergent nozzle has a throat dimension of at least about 0.005 mm. In some embodiments, the convergent-divergent nozzle has a throat dimension of at most about 0.5 mm. In some embodiments, the convergent-divergent nozzle has a throat dimension of about 0.005 mm to about 0.0075 mm, about 0.005 mm to about 0.01 mm, about 0.005 mm to about 0.025 mm, about 0.005 mm to about 0.05 mm, about 0.005 mm to about 0.075 mm, about 0.005 mm to about 0.1 mm, about 0.005 mm to about 0.2 mm, about 0.005 mm to about 0.3 mm, about 0.005 mm to about 0.4 mm, about 0.005 mm to about 0.5 mm, about 0.0075 mm to about 0.01 mm, about 0.0075 mm to about 0.025 mm, about 0.0075 mm to about 0.05 mm, about 0.0075 mm to about 0.075 mm, about 0.0075 mm to about 0.1 mm, about 0.0075 mm to about 0.2 mm, about 0.0075 mm to about 0.3 mm, about 0.0075 mm to about 0.4 mm, about 0.0075 mm to about 0.5 mm, about 0.01 mm to about 0.025 mm, about 0.01 mm to about 0.05 mm, about 0.01 mm to about 0.075 mm, about 0.01 mm to about 0.1 mm, about 0.01 mm to about 0.2 mm, about 0.01 mm to about 0.3 mm, about 0.01 mm to about 0.4 mm, about 0.01 mm to about 0.5 mm, about 0.025 mm to about 0.05 mm, about 0.025 mm to about 0.075 mm, about 0.025 mm to about 0.1 mm, about 0.025 mm to about 0.2 mm, about 0.025 mm to about 0.3 mm, about 0.025 mm to about 0.4 mm, about 0.025 mm to about 0.5 mm, about 0.05 mm to about 0.075 mm, about 0.05 mm to about 0.1 mm, about 0.05 mm to about 0.2 mm, about 0.05 mm to about 0.3 mm, about 0.05 mm to about 0.4 mm, about 0.05 mm to about 0.5 mm, about 0.075 mm to about 0.1 mm, about 0.075 mm to about 0.2 mm, about 0.075 mm to about 0.3 mm, about 0.075 mm to about 0.4 mm, about 0.075 mm to about 0.5 mm, about 0.1 mm to about 0.2 mm, about 0.1 mm to about 0.3 mm, about 0.1 mm to about 0.4 mm, about 0.1 mm to about 0.5 mm, about 0.2 mm to about 0.3 mm, about 0.2 mm to about 0.4 mm, about 0.2 mm to about 0.5 mm, about 0.3 mm to about 0.4 mm, about 0.3 mm to about 0.5 mm, or about 0.4 mm to about 0.5 mm. In some embodiments, the convergent-divergent nozzle has a throat dimension of about 0.005 mm, about 0.0075 mm, about 0.01 mm, about 0.025 mm, about 0.05 mm, about 0.075 mm, about 0.1 mm, about 0.2 mm, about 0.3 mm, about 0.4 mm, or about 0.5 mm.

In some embodiments, the convergent-divergent nozzle has an inlet or outlet dimension of about 3 mm to about 10 mm. In some embodiments, the convergent-divergent nozzle has an inlet or outlet dimension of at least about 3 mm. In some embodiments, the convergent-divergent nozzle has an inlet or outlet dimension of at most about 10 mm. In some embodiments, the convergent-divergent nozzle has an inlet or outlet dimension of about 3 mm to about 3.5 mm, about 3 mm to about 4 mm, about 3 mm to about 4.5 mm, about 3 mm to about 5 mm, about 3 mm to about 5.5 mm, about 3 mm to about 6 mm, about 3 mm to about 6.5 mm, about 3 mm to about 7 mm, about 3 mm to about 8 mm, about 3 mm to about 9 mm, about 3 mm to about 10 mm, about 3.5 mm to about 4 mm, about 3.5 mm to about 4.5 mm, about 3.5 mm to about 5 mm, about 3.5 mm to about 5.5 mm, about 3.5 mm to about 6 mm, about 3.5 mm to about 6.5 mm, about 3.5 mm to about 7 mm, about 3.5 mm to about 8 mm, about 3.5 mm to about 9 mm, about 3.5 mm to about 10 mm, about 4 mm to about 4.5 mm, about 4 mm to about 5 mm, about 4 mm to about 5.5 mm, about 4 mm to about 6 mm, about 4 mm to about 6.5 mm, about 4 mm to about 7 mm, about 4 mm to about 8 mm, about 4 mm to about 9 mm, about 4 mm to about 10 mm, about 4.5 mm to about 5 mm, about 4.5 mm to about 5.5 mm, about 4.5 mm to about 6 mm, about 4.5 mm to about 6.5 mm, about 4.5 mm to about 7 mm, about 4.5 mm to about 8 mm, about 4.5 mm to about 9 mm, about 4.5 mm to about 10 mm, about 5 mm to about 5.5 mm, about 5 mm to about 6 mm, about 5 mm to about 6.5 mm, about 5 mm to about 7 mm, about 5 mm to about 8 mm, about 5 mm to about 9 mm, about 5 mm to about 10 mm, about 5.5 mm to about 6 mm, about 5.5 mm to about 6.5 mm, about 5.5 mm to about 7 mm, about 5.5 mm to about 8 mm, about 5.5 mm to about 9 mm, about 5.5 mm to about 10 mm, about 6 mm to about 6.5 mm, about 6 mm to about 7 mm, about 6 mm to about 8 mm, about 6 mm to about 9 mm, about 6 mm to about 10 mm, about 6.5 mm to about 7 mm, about 6.5 mm to about 8 mm, about 6.5 mm to about 9 mm, about 6.5 mm to about 10 mm, about 7 mm to about 8 mm, about 7 mm to about 9 mm, about 7 mm to about 10 mm, about 8 mm to about 9 mm, about 8 mm to about 10 mm, or about 9 mm to about 10 mm. In some embodiments, the convergent-divergent nozzle has an inlet or outlet dimension of about 3 mm, about 3.5 mm, about 4 mm, about 4.5 mm, about 5 mm, about 5.5 mm, about 6 mm, about 6.5 mm, about 7 mm, about 8 mm, about 9 mm, or about 10 mm.

In some embodiments, the convergent-divergent nozzle has a length of about 15 centimeters (cm) to about 60 cm. In some embodiments, the convergent-divergent nozzle has a length of at least about 15 cm. In some embodiments, the convergent-divergent nozzle has a length of at most about 60 cm. In some embodiments, the convergent-divergent nozzle has a length of about 15 cm to about 20 cm, about 15 cm to about 25 cm, about 15 cm to about 30 cm, about 15 cm to about 35 cm, about 15 cm to about 40 cm, about 15 cm to about 45 cm, about 15 cm to about 50 cm, about 15 cm to about 55 cm, about 15 cm to about 60 cm, about 20 cm to about 25 cm, about 20 cm to about 30 cm, about 20 cm to about 35 cm, about 20 cm to about 40 cm, about 20 cm to about 45 cm, about 20 cm to about 50 cm, about 20 cm to about 55 cm, about 20 cm to about 60 cm, about 25 cm to about 30 cm, about 25 cm to about 35 cm, about 25 cm to about 40 cm, about 25 cm to about 45 cm, about 25 cm to about 50 cm, about 25 cm to about 55 cm, about 25 cm to about 60 cm, about 30 cm to about 35 cm, about 30 cm to about 40 cm, about 30 cm to about 45 cm, about 30 cm to about 50 cm, about 30 cm to about 55 cm, about 30 cm to about 60 cm, about 35 cm to about 40 cm, about 35 cm to about 45 cm, about 35 cm to about 50 cm, about 35 cm to about 55 cm, about 35 cm to about 60 cm, about 40 cm to about 45 cm, about 40 cm to about 50 cm, about 40 cm to about 55 cm, about 40 cm to about 60 cm, about 45 cm to about 50 cm, about 45 cm to about 55 cm, about 45 cm to about 60 cm, about 50 cm to about 55 cm, about 50 cm to about 60 cm, or about 55 cm to about 60 cm. In some embodiments, the convergent-divergent nozzle has a length of about 15 cm, about 20 cm, about 25 cm, about 30 cm, about 35 cm, about 40 cm, about 45 cm, about 50 cm, about 55 cm, or about 60 cm.

In some embodiments, the convergent-divergent nozzle has at least one of a throat-to-inlet dimension ratio and a throat-to-outlet dimension ratio of about 15 to about 60. In some embodiments, the convergent-divergent nozzle has at least one of a throat-to-inlet dimension ratio and a throat-to-outlet dimension ratio of at least about 15. In some embodiments, the convergent-divergent nozzle has at least one of a throat-to-inlet dimension ratio and a throat-to-outlet dimension ratio of at most about 60. In some embodiments, the convergent-divergent nozzle has at least one of a throat-to-inlet dimension ratio and a throat-to-outlet dimension ratio of about 15 to about 20, about 15 to about 25, about 15 to about 30, about 15 to about 35, about 15 to about 40, about 15 to about 45, about 15 to about 50, about 15 to about 55, about 15 to about 60, about 20 to about 25, about 20 to about 30, about 20 to about 35, about 20 to about 40, about 20 to about 45, about 20 to about 50, about 20 to about 55, about 20 to about 60, about 25 to about 30, about 25 to about 35, about 25 to about 40, about 25 to about 45, about 25 to about 50, about 25 to about 55, about 25 to about 60, about 30 to about 35, about 30 to about 40, about 30 to about 45, about 30 to about 50, about 30 to about 55, about 30 to about 60, about 35 to about 40, about 35 to about 45, about 35 to about 50, about 35 to about 55, about 35 to about 60, about 40 to about 45, about 40 to about 50, about 40 to about 55, about 40 to about 60, about 45 to about 50, about 45 to about 55, about 45 to about 60, about 50 to about 55, about 50 to about 60, or about 55 to about 60. In some embodiments, the convergent-divergent nozzle has at least one of a throat-to-inlet dimension ratio and a throat-to-outlet dimension ratio of about 15, about 20, about 25, about 30, about 35, about 40, about 45, about 50, about 55, or about 60.

In some embodiments, a percent of the 2D layered material that is produced from the exfoliated 2D material is about 50% to about 100%. In some embodiments, the percent of the 2D layered material that is produced from the exfoliated 2D material is at least about 50%. In some embodiments, the percent of the 2D layered material that is produced from the exfoliated 2D material is at most about 100%. In some embodiments, the percent of the 2D layered material that is produced from the exfoliated 2D material is about 50% to about 55%, about 50% to about 60%, about 50% to about 65%, about 50% to about 70%, about 50% to about 75%, about 50% to about 80%, about 50% to about 85%, about 50% to about 90%, about 50% to about 95%, about 50% to about 100%, about 55% to about 60%, about 55% to about 65%, about 55% to about 70%, about 55% to about 75%, about 55% to about 80%, about 55% to about 85%, about 55% to about 90%, about 55% to about 95%, about 55% to about 100%, about 60% to about 65%, about 60% to about 70%, about 60% to about 75%, about 60% to about 80%, about 60% to about 85%, about 60% to about 90%, about 60% to about 95%, about 60% to about 100%, about 65% to about 70%, about 65% to about 75%, about 65% to about 80%, about 65% to about 85%, about 65% to about 90%, about 65% to about 95%, about 65% to about 100%, about 70% to about 75%, about 70% to about 80%, about 70% to about 85%, about 70% to about 90%, about 70% to about 95%, about 70% to about 100%, about 75% to about 80%, about 75% to about 85%, about 75% to about 90%, about 75% to about 95%, about 75% to about 100%, about 80% to about 85%, about 80% to about 90%, about 80% to about 95%, about 80% to about 100%, about 85% to about 90%, about 85% to about 95%, about 85% to about 100%, about 90% to about 95%, about 90% to about 100%, or about 95% to about 100%. In some embodiments, the percent of the 2D layered material that is produced from the exfoliated 2D material is about 50%, about 55%, about 60%, about 65%, about 70%, about 75%, about 80%, about 85%, about 90%, about 95%, or about 100%.

In some embodiments, the exfoliated 2D material comprises a plurality of flakes with an average aspect ratio of about 10 to about 1,000. In some embodiments, the exfoliated 2D material comprises a plurality of flakes with an average aspect ratio of at least about 10. In some embodiments, the exfoliated 2D material comprises a plurality of flakes with an average aspect ratio of at most about 1,000. In some embodiments, the exfoliated 2D material comprises a plurality of flakes with an average aspect ratio of about 10 to about 25, about 10 to about 50, about 10 to about 75, about 10 to about 100, about 10 to about 200, about 10 to about 300, about 10 to about 400, about 10 to about 500, about 10 to about 600, about 10 to about 800, about 10 to about 1,000, about 25 to about 50, about 25 to about 75, about 25 to about 100, about 25 to about 200, about 25 to about 300, about 25 to about 400, about 25 to about 500, about 25 to about 600, about 25 to about 800, about 25 to about 1,000, about 50 to about 75, about 50 to about 100, about 50 to about 200, about 50 to about 300, about 50 to about 400, about 50 to about 500, about 50 to about 600, about 50 to about 800, about 50 to about 1,000, about 75 to about 100, about 75 to about 200, about 75 to about 300, about 75 to about 400, about 75 to about 500, about 75 to about 600, about 75 to about 800, about 75 to about 1,000, about 100 to about 200, about 100 to about 300, about 100 to about 400, about 100 to about 500, about 100 to about 600, about 100 to about 800, about 100 to about 1,000, about 200 to about 300, about 200 to about 400, about 200 to about 500, about 200 to about 600, about 200 to about 800, about 200 to about 1,000, about 300 to about 400, about 300 to about 500, about 300 to about 600, about 300 to about 800, about 300 to about 1,000, about 400 to about 500, about 400 to about 600, about 400 to about 800, about 400 to about 1,000, about 500 to about 600, about 500 to about 800, about 500 to about 1,000, about 600 to about 800, about 600 to about 1,000, or about 800 to about 1,000.

In some embodiments, the exfoliated 2D material comprises a plurality of flakes with an average thickness of about 0.35 nm to about 10 nm. In some embodiments, the exfoliated 2D material comprises a plurality of flakes with an average thickness of at least about 0.35 nm. In some embodiments, the exfoliated 2D material comprises a plurality of flakes with an average thickness of at most about 10 nm. In some embodiments, the exfoliated 2D material comprises a plurality of flakes with an average thickness of about 0.35 nm to about 0.5 nm, about 0.35 nm to about 1 nm, about 0.35 nm to about 2 nm, about 0.35 nm to about 3 nm, about 0.35 nm to about 4 nm, about 0.35 nm to about 5 nm, about 0.35 nm to about 6 nm, about 0.35 nm to about 7 nm, about 0.35 nm to about 8 nm, about 0.35 nm to about 9 nm, about 0.35 nm to about 10 nm, about 0.5 nm to about 1 nm, about 0.5 nm to about 2 nm, about 0.5 nm to about 3 nm, about 0.5 nm to about 4 nm, about 0.5 nm to about 5 nm, about 0.5 nm to about 6 nm, about 0.5 nm to about 7 nm, about 0.5 nm to about 8 nm, about 0.5 nm to about 9 nm, about 0.5 nm to about 10 nm, about 1 nm to about 2 nm, about 1 nm to about 3 nm, about 1 nm to about 4 nm, about 1 nm to about 5 nm, about 1 nm to about 6 nm, about 1 nm to about 7 nm, about 1 nm to about 8 nm, about 1 nm to about 9 nm, about 1 nm to about 10 nm, about 2 nm to about 3 nm, about 2 nm to about 4 nm, about 2 nm to about 5 nm, about 2 nm to about 6 nm, about 2 nm to about 7 nm, about 2 nm to about 8 nm, about 2 nm to about 9 nm, about 2 nm to about 10 nm, about 3 nm to about 4 nm, about 3 nm to about 5 nm, about 3 nm to about 6 nm, about 3 nm to about 7 nm, about 3 nm to about 8 nm, about 3 nm to about 9 nm, about 3 nm to about 10 nm, about 4 nm to about 5 nm, about 4 nm to about 6 nm, about 4 nm to about 7 nm, about 4 nm to about 8 nm, about 4 nm to about 9 nm, about 4 nm to about 10 nm, about 5 nm to about 6 nm, about 5 nm to about 7 nm, about 5 nm to about 8 nm, about 5 nm to about 9 nm, about 5 nm to about 10 nm, about 6 nm to about 7 nm, about 6 nm to about 8 nm, about 6 nm to about 9 nm, about 6 nm to about 10 nm, about 7 nm to about 8 nm, about 7 nm to about 9 nm, about 7 nm to about 10 nm, about 8 nm to about 9 nm, about 8 nm to about 10 nm, or about 9 nm to about 10 nm. In some embodiments, the exfoliated 2D material comprises a plurality of flakes with an average thickness of about 0.35 nm, about 0.5 nm, about 1 nm, about 2 nm, about 3 nm, about 4 nm, about 5 nm, about 6 nm, about 7 nm, about 8 nm, about 9 nm, or about 10 nm.

In some embodiments, the exfoliated 2D material comprises a plurality of flakes with an average length of about 50 nm to about 1,600 nm. In some embodiments, the exfoliated 2D material comprises a plurality of flakes with a length of at least about 50 nm. In some embodiments, the exfoliated 2D material comprises a plurality of flakes with an average length of at most about 1,600 nm. In some embodiments, the exfoliated 2D material comprises a plurality of flakes with an average length of about 50 nm to about 100 nm, about 50 nm to about 200 nm, about 50 nm to about 300 nm, about 50 nm to about 400 nm, about 50 nm to about 500 nm, about 50 nm to about 750 nm, about 50 nm to about 1,000 nm, about 50 nm to about 1,250 nm, about 50 nm to about 1,500 nm, about 50 nm to about 1,600 nm, about 100 nm to about 200 nm, about 100 nm to about 300 nm, about 100 nm to about 400 nm, about 100 nm to about 500 nm, about 100 nm to about 750 nm, about 100 nm to about 1,000 nm, about 100 nm to about 1,250 nm, about 100 nm to about 1,500 nm, about 100 nm to about 1,600 nm, about 200 nm to about 300 nm, about 200 nm to about 400 nm, about 200 nm to about 500 nm, about 200 nm to about 750 nm, about 200 nm to about 1,000 nm, about 200 nm to about 1,250 nm, about 200 nm to about 1,500 nm, about 200 nm to about 1,600 nm, about 300 nm to about 400 nm, about 300 nm to about 500 nm, about 300 nm to about 750 nm, about 300 nm to about 1,000 nm, about 300 nm to about 1,250 nm, about 300 nm to about 1,500 nm, about 300 nm to about 1,600 nm, about 400 nm to about 500 nm, about 400 nm to about 750 nm, about 400 nm to about 1,000 nm, about 400 nm to about 1,250 nm, about 400 nm to about 1,500 nm, about 400 nm to about 1,600 nm, about 500 nm to about 750 nm, about 500 nm to about 1,000 nm, about 500 nm to about 1,250 nm, about 500 nm to about 1,500 nm, about 500 nm to about 1,600 nm, about 750 nm to about 1,000 nm, about 750 nm to about 1,250 nm, about 750 nm to about 1,500 nm, about 750 nm to about 1,600 nm, about 1,000 nm to about 1,250 nm, about 1,000 nm to about 1,500 nm, about 1,000 nm to about 1,600 nm, about 1,250 nm to about 1,500 nm, about 1,250 nm to about 1,600 nm, or about 1,500 nm to about 1,600 nm. In some embodiments, the exfoliated 2D material comprises a plurality of flakes with an average length of about 50 nm, about 100 nm, about 200 nm, about 300 nm, about 400 nm, about 500 nm, about 750 nm, about 1,000 nm, about 1,250 nm, about 1,500 nm, or about 1,600 nm.

In some embodiments, a centrifuging of the exfoliated 2D material is performed at a rate of about 700 revolutions per minute (rpm) to about 4,000 rpm. In some embodiments, the centrifuging is performed at a rate of at least about 700 rpm. In some embodiments, the centrifuging is performed at a rate of at most about 4,000 rpm. In some embodiments, the centrifuging is performed at a rate of about 700 rpm to about 800 rpm, about 700 rpm to about 1,000 rpm, about 700 rpm to about 1,200 rpm, about 700 rpm to about 1,400 rpm, about 700 rpm to about 1,600 rpm, about 700 rpm to about 1,800 rpm, about 700 rpm to about 2,000 rpm, about 700 rpm to about 2,500 rpm, about 700 rpm to about 3,000 rpm, about 700 rpm to about 3,500 rpm, about 700 rpm to about 4,000 rpm, about 800 rpm to about 1,000 rpm, about 800 rpm to about 1,200 rpm, about 800 rpm to about 1,400 rpm, about 800 rpm to about 1,600 rpm, about 800 rpm to about 1,800 rpm, about 800 rpm to about 2,000 rpm, about 800 rpm to about 2,500 rpm, about 800 rpm to about 3,000 rpm, about 800 rpm to about 3,500 rpm, about 800 rpm to about 4,000 rpm, about 1,000 rpm to about 1,200 rpm, about 1,000 rpm to about 1,400 rpm, about 1,000 rpm to about 1,600 rpm, about 1,000 rpm to about 1,800 rpm, about 1,000 rpm to about 2,000 rpm, about 1,000 rpm to about 2,500 rpm, about 1,000 rpm to about 3,000 rpm, about 1,000 rpm to about 3,500 rpm, about 1,000 rpm to about 4,000 rpm, about 1,200 rpm to about 1,400 rpm, about 1,200 rpm to about 1,600 rpm, about 1,200 rpm to about 1,800 rpm, about 1,200 rpm to about 2,000 rpm, about 1,200 rpm to about 2,500 rpm, about 1,200 rpm to about 3,000 rpm, about 1,200 rpm to about 3,500 rpm, about 1,200 rpm to about 4,000 rpm, about 1,400 rpm to about 1,600 rpm, about 1,400 rpm to about 1,800 rpm, about 1,400 rpm to about 2,000 rpm, about 1,400 rpm to about 2,500 rpm, about 1,400 rpm to about 3,000 rpm, about 1,400 rpm to about 3,500 rpm, about 1,400 rpm to about 4,000 rpm, about 1,600 rpm to about 1,800 rpm, about 1,600 rpm to about 2,000 rpm, about 1,600 rpm to about 2,500 rpm, about 1,600 rpm to about 3,000 rpm, about 1,600 rpm to about 3,500 rpm, about 1,600 rpm to about 4,000 rpm, about 1,800 rpm to about 2,000 rpm, about 1,800 rpm to about 2,500 rpm, about 1,800 rpm to about 3,000 rpm, about 1,800 rpm to about 3,500 rpm, about 1,800 rpm to about 4,000 rpm, about 2,000 rpm to about 2,500 rpm, about 2,000 rpm to about 3,000 rpm, about 2,000 rpm to about 3,500 rpm, about 2,000 rpm to about 4,000 rpm, about 2,500 rpm to about 3,000 rpm, about 2,500 rpm to about 3,500 rpm, about 2,500 rpm to about 4,000 rpm, about 3,000 rpm to about 3,500 rpm, about 3,000 rpm to about 4,000 rpm, or about 3,500 rpm to about 4,000 rpm. In some embodiments, the centrifuging is performed at a rate of about 700 rpm, about 800 rpm, about 1,000 rpm, about 1,200 rpm, about 1,400 rpm, about 1,600 rpm, about 1,800 rpm, about 2,000 rpm, about 2,500 rpm, about 3,000 rpm, about 3,500 rpm, or about 4,000 rpm.

In some embodiments, the centrifuging of the exfoliated 2D material is performed for a period of time of about 2 minutes to about 180 minutes. In some embodiments, the centrifuging is performed for a period of time of at least about 2 minutes. In some embodiments, the centrifuging is performed for a period of time of at most about 180 minutes. In some embodiments, the centrifuging is performed for a period of time of about 2 minutes to about 5 minutes, about 2 minutes to about 10 minutes, about 2 minutes to about 25 minutes, about 2 minutes to about 50 minutes, about 2 minutes to about 75 minutes, about 2 minutes to about 100 minutes, about 2 minutes to about 125 minutes, about 2 minutes to about 150 minutes, about 2 minutes to about 180 minutes, about 5 minutes to about 10 minutes, about 5 minutes to about 25 minutes, about 5 minutes to about 50 minutes, about 5 minutes to about 75 minutes, about 5 minutes to about 100 minutes, about 5 minutes to about 125 minutes, about 5 minutes to about 150 minutes, about 5 minutes to about 180 minutes, about 10 minutes to about 25 minutes, about 10 minutes to about 50 minutes, about 10 minutes to about 75 minutes, about 10 minutes to about 100 minutes, about 10 minutes to about 125 minutes, about 10 minutes to about 150 minutes, about 10 minutes to about 180 minutes, about 25 minutes to about 50 minutes, about 25 minutes to about 75 minutes, about 25 minutes to about 100 minutes, about 25 minutes to about 125 minutes, about 25 minutes to about 150 minutes, about 25 minutes to about 180 minutes, about 50 minutes to about 75 minutes, about 50 minutes to about 100 minutes, about 50 minutes to about 125 minutes, about 50 minutes to about 150 minutes, about 50 minutes to about 180 minutes, about 75 minutes to about 100 minutes, about 75 minutes to about 125 minutes, about 75 minutes to about 150 minutes, about 75 minutes to about 180 minutes, about 100 minutes to about 125 minutes, about 100 minutes to about 150 minutes, about 100 minutes to about 180 minutes, about 125 minutes to about 150 minutes, about 125 minutes to about 180 minutes, or about 150 minutes to about 180 minutes. In some embodiments, the centrifuging is performed for a period of time of about 2 minutes, about 5 minutes, about 10 minutes, about 25 minutes, about 50 minutes, about 75 minutes, about 100 minutes, about 125 minutes, about 150 minutes, or about 180 minutes.

BRIEF DESCRIPTION OF THE DRAWINGS

The accompanying drawing figures incorporated in and forming a part of this specification illustrate several aspects of the disclosure and, together with the description, serve to explain the principles of the disclosure.

FIG. 8A displays an exemplary CFD shear rate surface plot in the flow channel at an upstream pressure of 1.4 megapascals (MPa).

FIG. 8B displays an exemplary CFD shear rate surface plot in the flow channel at an upstream pressure of 2.8 MPa.

FIG. 8C displays an exemplary CFD shear rate surface plot in the flow channel at an upstream pressure of 5.5 MPa.

FIG. 8D displays an exemplary CFD shear rate surface plot in the flow channel at an upstream pressure of 14 MPa.

FIG. 9A displays an exemplary CFD velocity surface plot of boron nitride (BN) in the flow channel at an upstream pressure of 5.5 MPa and a gap of 0.1 millimeter (mm).

FIG. 9B displays an exemplary line scan profile of the shear rates at the minimum cross-section of BN in the flow channel at an upstream pressure of 5.5 MPa and a gap of 0.1 mm.

FIG. 13A displays an exemplary atomic force microscopy scan image of a BN flake isolated after CFE with insets showing the height profile and thickness distribution FIG. 13B displays an exemplary transmission electron microscopy (TEM) image of a diffraction pattern of a BN 2D material produced by CFE.

FIG. 13C displays an exemplary TEM image of a diffraction pattern of a graphite 2D material produced by CFE.

FIG. 13D displays an exemplary TEM image of a diffraction pattern of a molybdenum disulfide 2D material produced by CFE.

FIG. 14A displays a first exemplary TEM image of a re-stacked BN nanosheet with Moire regions.

FIG. 14B displays a second exemplary TEM image of a re-stacked BN nanosheet with Moire regions.

FIG. 14C displays a third exemplary TEM image of a re-stacked BN nanosheet with Moire regions.

DETAILED DESCRIPTION OF THE DRAWINGS

Figure 1:
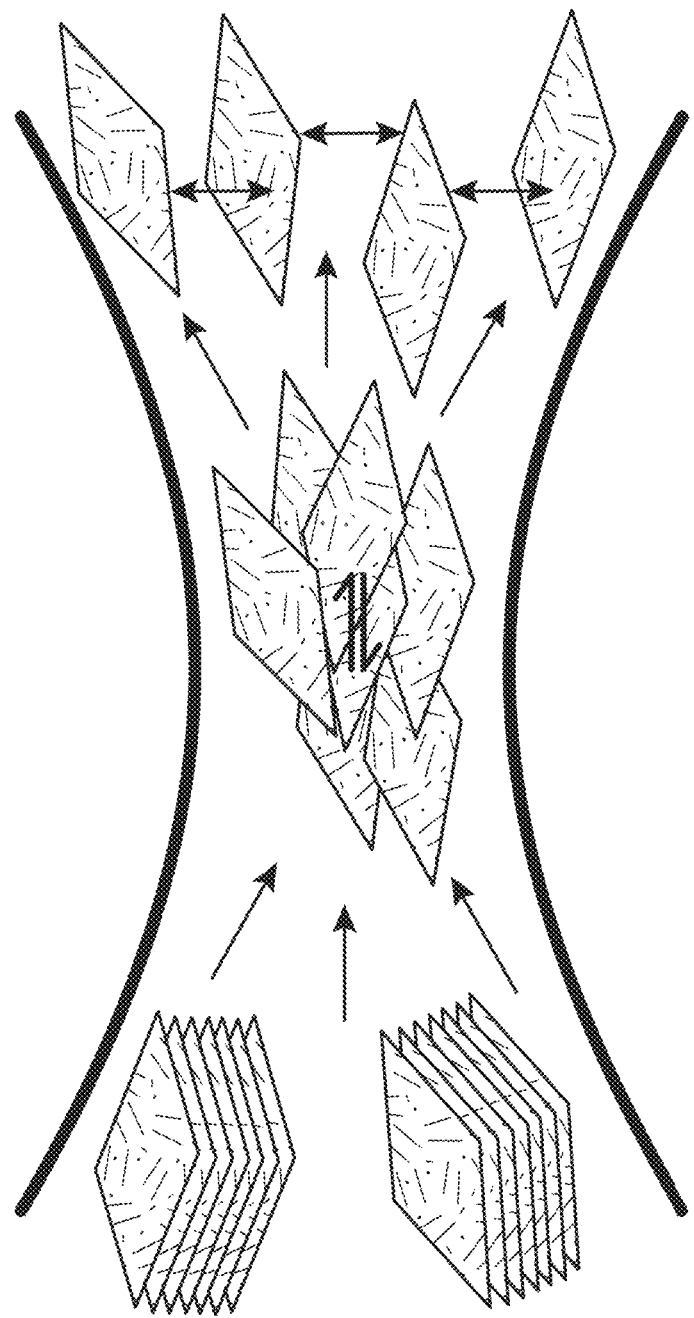
FIG. 1 is a diagram illustrating the exfoliation of two-dimensional (2D) layered materials passed through a converging-diverging channel.

Those skilled in the art will appreciate the scope of the present disclosure and realize additional aspects thereof after reading the following detailed description in association with the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Methods of Forming Shear Exfoliated 2D Layered Materials

The present disclosure relates to a simple and continuous method for exfoliating a wide array of 2D materials, by compression and expansion of a high-pressure flow of a compressible gas. Unlike other methods for the exfoliation of 2D layered materials, such as chemical intercalation or sonication, the method of the present disclosure relies only on the physical compression and expansion of a flow of high-pressure gases, thus reducing the defects on the 2D layered material. This method can be employed as an environmentally friendly process by using an inert or benign gas such as nitrogen, helium, or compressed air.

Furthermore, unlike other batch processes, methods taught herein rely on a continuous feed of a mixture of carrier gas and 2D layered material, enabling a continuous method suitable for mass manufacturing. The critical parameters controlling the exfoliation (yield and efficiency) of single layer 2D material are the carrier gas flow shear, flow compression and expansion, and flow pressure shock waves, which are easily achieved by flowing the material through a converging and diverging channel profile and/or a narrow orifice or tube. These profiles, and the flow compression and expansion, are common in the flow of compressible gases and can be intentionally controlled by devices such as a de Laval nozzle, orifices, fluid injectors, constant-area ducts, or compressor blades in turbines or by methods such as partially or fully opening valves and other fittings. A wide variety of gases such as carbon dioxide, nitrogen, helium, argon, and compressed air are usable to effectively to exfoliate 2D layered materials. The present method provides an improved process for the continuous mass production of exfoliated 2D layered materials.

The preparation of 2D materials can be categorized by either the bottom-up or top-down approach. The bottom-up approach constructs the 2D material from depositing various chemical precursors or sources onto a substrate. Common methods in this approach include chemical vapor deposition and physical vapor deposition. The nanomaterial thickness, composition, and structural homogeneity are easy to control, and the synthesized material has a high quality, making these methods suitable for producing highly sensitive electronic devices. However, the main limitations of the bottom-up approach are the substrate interference effects and the limited process scalability, due to low material throughput and the high costs of operations in a vacuum environment.

In contrast, the top-down approach separates or exfoliates a bulk 2D material into one or more layers. This approach enables higher throughputs and hence scalability and may be performed by methods such as ion intercalation, liquid phase exfoliation, micromechanical cleavage (i.e., the cellophane tape method), and the popular oxidation-reduction-based Hummer's method, which is commonly used for the large-scale production of graphene from the reduction of graphite oxide.

Ultrasonication-based liquid-phase exfoliation techniques employ turbulent flows in liquids to generate high shear rates, which assist in layer separation. Such shear rates can be easily achieved in mixers and blenders, where rotor-stator gaps are on the order of 100 micrometers ($\mu m$). Microfluidization under turbulent flow conditions with high shear rates ($\sim 10^8$ s$^{-1}$) results in 100% exfoliation without the need for size separation by centrifugation. Microfluidization comprises passing a surfactant-stabilized liquid suspension of graphite through small orifices (100 $\mu m$) using high pressures (up to 200 megapascals [MPa]) for repeated cycles of up to 100 cycles. The advantage of the process is high yields, and the lack of a requirement for size separation can be offset by the time-based treatments, the use of surface property-modifying surfactants, and a wide poly-dispersity of the final product.

Top-down methods of 2D layered nanomaterial synthesis, as the name implies, requires the use of high-pressure gases, including supercritical fluids, to assist with separating the layers. The majority of gas phase exfoliation studies thus far have used supercritical carbon dioxide (sCO$_2$) as the gaseous medium. Since $sCO_2$ exhibits a low surface tension and a high density, it can be employed to diffuse the 2D layered materials.

At high pressures, there is a sufficient driving force for diffusion of gas molecules in between the layers of the 2D bulk crystal. In some embodiments, the diffusion time can be shortened to the order of minutes by increasing the temperature of the system. Following, an appropriate treatment of diffusion time and temperature, the pressure is rapidly released to cause the gas molecules in between the layers to expand and separate the layers driven by the high pressure differential. Many gel polymer electrolyte processes require bulk processing as gas intercalation and require a certain minimum time to be complete. In some processes, once gas diffusion is complete, some time-based stimulus in the form of mechanical agitation/shear, ultrasound, or surfactant uptake is required to disturb the layered crystals.

Provided herein are continuous, high-throughput production methods for forming exfoliated 2D materials caused by shear due to supersonic flows of compressible gases. In the methods provided herein, an amount of 2D layered material is rapidly forced through a small orifice using high-pressure gases, without the need for any time-based treatment. Shear-based exfoliation occurs due to the high velocities that expanding and accelerating gases achieve in small orifices, coupled with wall friction effect in fine orifices and resulting in a high shear rate ($\dot{\gamma} \geq 10^5$ s$^{-1}$) experienced by the 2D layered particles. The versatility of the methods herein are demonstrated by applying this method to exfoliate different 2D layered material (graphene, $MoS_2$, and boron nitride) and to demonstrate that the method provided herein is utile, irrespective of the carrier fluid used.

The present disclosure relates to a simple method of continuously exfoliating various two-dimensional (2D) layered materials through the compression and expansion of a compressible high-pressure fluid. Any 2D layered material, characterized by weak, non-covalent bonds in the c-axis, can be exfoliated into single and few layer sheet materials by this method. Any compressible fluid under high pressure can be used in this method. Exfoliation of several 2D layered materials has been successfully demonstrated, including for molybdenum disulfide ($MoS_2$), boron nitride (BN), and graphite, using a variety of high-pressure fluids such as helium, nitrogen gas, supercritical carbon dioxide, and compressed air.

Figure 2:
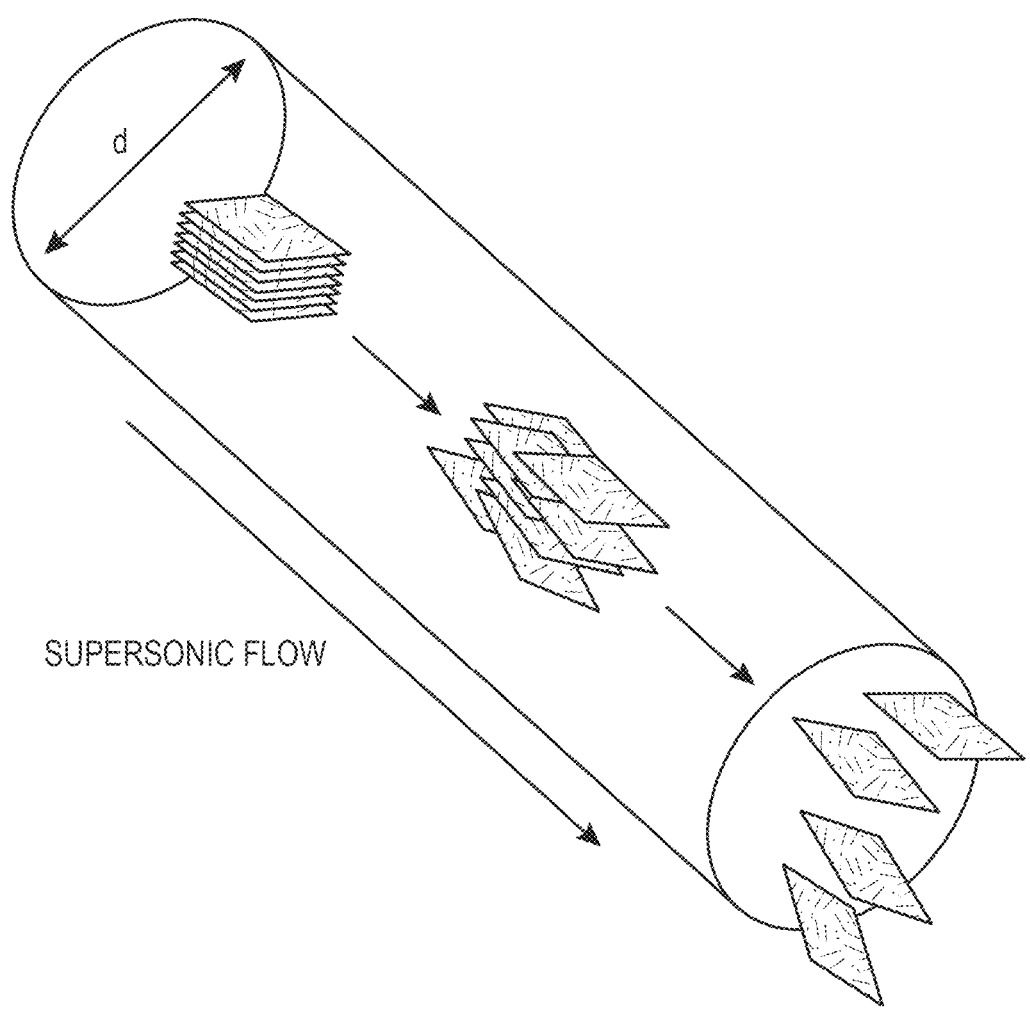
FIG. 2 is a diagram illustrating the exfoliation of 2D layered materials passed through an orifice at supersonic speeds.
Figure 3A:
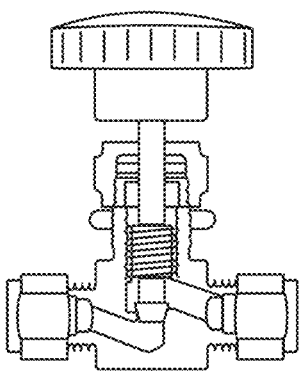
FIG. 3A displays an exemplary diagram of a needle valve.
Figure 3B:
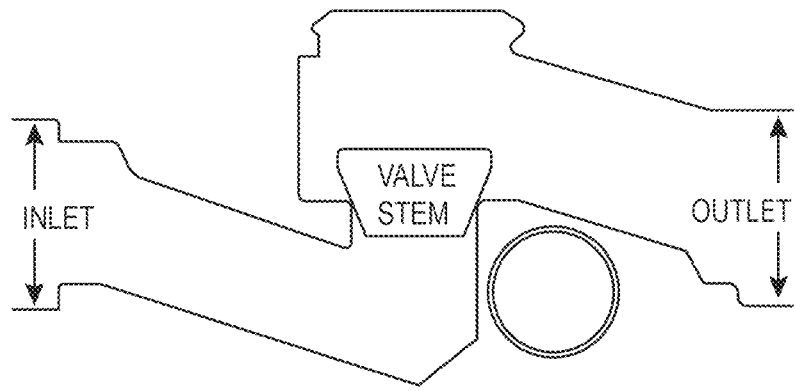
FIG. 3B displays an exemplary diagram of the valve stem and the flow channel.
Figure 3C:
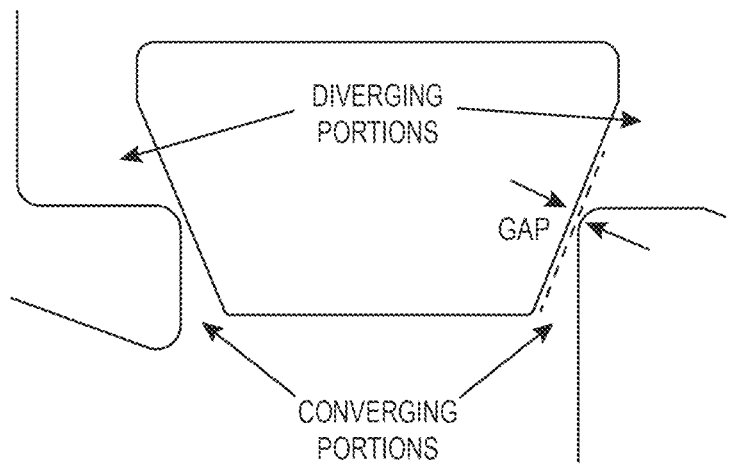
FIG. 3C displays an exemplary diagram of a close-up view of the valve stem.

In the embodiments described herein, any amount of 2D layered material is rapidly forced through a small orifice using high-pressure gases, per FIG. 2, without the need for any time-based treatment such as allowing the 2D layered material to be intercalated by the high pressure gas(es) before exfoliation, unlike other shear-based and gas processes. In particular, a continuous flow of a mixture of the 2D layered material and compressible fluid are passed through a convergent-divergent nozzle to exfoliate the 2D layered material before the compressible fluid intercalates the 2D layered material. Exfoliation of the 2D layered material will occur without intercalation of the 2D layered material during operation of the embodiments of the present disclosure.

The continuous flow exfoliation (CFE) method involves bulk 2D layered materials that are suspended in a gas, which passes through a flow compression channel (e.g., a small orifice, converging channel, or thin tube) and then is allowed to expand into ambient conditions. In at least one exemplary embodiment, the 2D layered material is continuously fed into a continuous flow of gas. The flow velocity and expansion pressures can be controlled through the appropriate design of an exit channel, such as a carefully designed converging-diverging (de Laval) nozzle or an orifice. During this process, the gaseous medium achieves supersonic (Mach 1 or greater) velocities, which are necessary to generate the high shear rate environment for 2D particle exfoliation.

In one experiment, 0.1 gram (g) of a 2D layered material is placed in a 50 milliliter (mL), high-pressure vessel and is sealed. The high-pressure fluid, with pressures in the range of 200 to 2000 pounds per square inch (psi), is then released into the vessel and the mixture of fluid and 2D material is allowed to flow through a channel structured to compress and expand the fluid. In one embodiment, compression results in the continuous flow of a 2D material mixture of compressible fluid and the 2D layered material being under a pressure of between 200 psi and 1100 psi. In another embodiment, compression results in the continuous flow of the 2D material mixture of compressible fluid and the 2D layered material being under a pressure of between 1100 psi and 2000 psi. A channel with such characteristics can be appropriately designed, as in the case of convergent-divergent nozzles (diffusers) or the de Laval nozzle; or various fluid mechanics apparatus can be introduced, such as fluid injectors, valves, compressor blades, and other fittings that provide these characteristics. As a compressible fluid flows through a converging-diverging channel, the pressure of the flow starts to drop and the velocity of the flow increases, which for sub-sonic flow (Mach number<1) is the maximum at the narrowest part of the channel (the throat). However, if the pressure difference between the upstream and downstream sides is greater than a critical value, then the flow velocity at the throat reaches the Mach number (supersonic flows), and the flow is said to be choked. Under these choked flow conditions, the velocity of the fluid is very high, providing sufficient energy for shearing single layers of the 2D layered materials apart from each other. Furthermore, due to low pressures, significant flow expansion occurs in the divergent section of the channel, which aids in the separation of single-layer 2D layered materials. Even furthermore, a shock wave, signified as an abrupt change in pressure, can occur in the divergent section of the channel, which aids in the separation of single-layer 2D layered materials. After passing through the converging-diverging profile, the flow containing the separated 2D layered materials is collected either in a dry state or a wet state using an appropriate solvent.

FIG. 1 illustrates the exfoliation of 2D layered materials when passed through a converging-diverging channel. Three mechanisms for the exfoliation of the particle are the following: (1) shearing between fluid layers due to velocity gradients caused by turbulence (Reynolds stress) and wall friction, (2) low-pressure zone causing rapid expansion of the gas within the diverging and exit portions of the channel during supersonic flow, and (3) an abrupt change in pressure caused by a shock wave within the diverging and exit portions of the channel during supersonic flow.

A controlling factor during the venting process is to achieve a very high pressure difference between the flow inlet and exit so as to allow the 2D layered material to flow very fast and become sheared or expanded as the flow is converged and diverged, as shown in FIG. 1. Another influencing factor of the venting process is the design of the flow-constricting nozzle or channel profile. The extracted material can be used as is in the dry state, or it can be extracted onto any appropriate solvent forming stable colloidal solutions. The extract in the wet state can be centrifuged to separate the single or few layered 2D material from the bulk non-exfoliated product.

Figure 4:
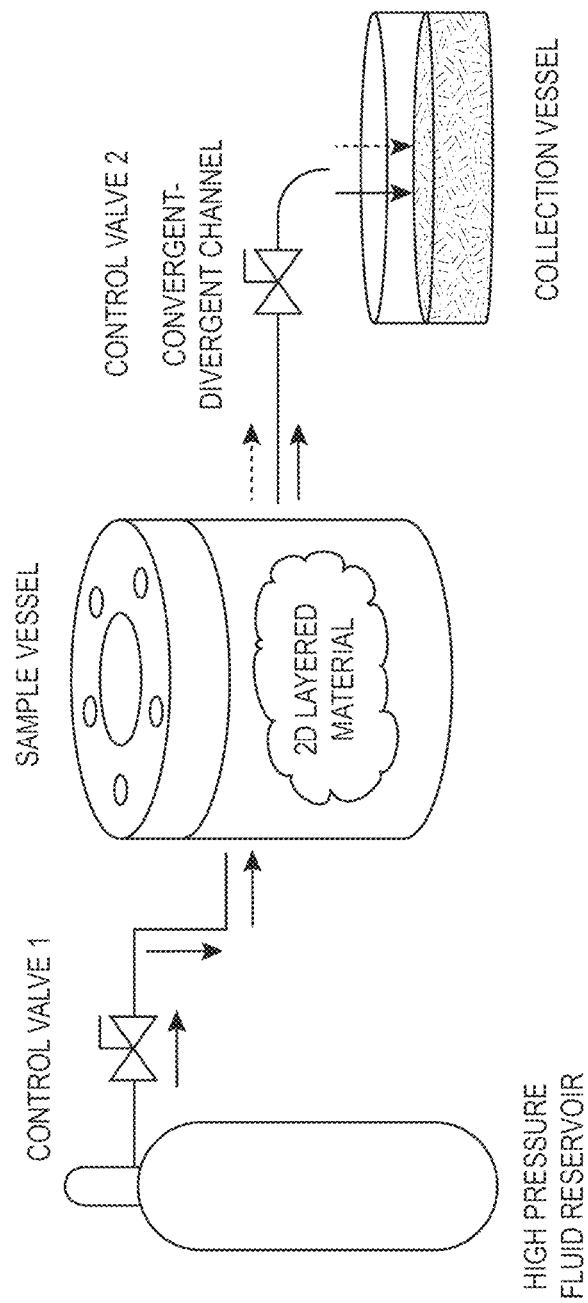
FIG. 4 is a diagram illustrating an exemplary apparatus for exfoliating 2D layered materials by high-pressure flow compression and expansion.
Figure 5:
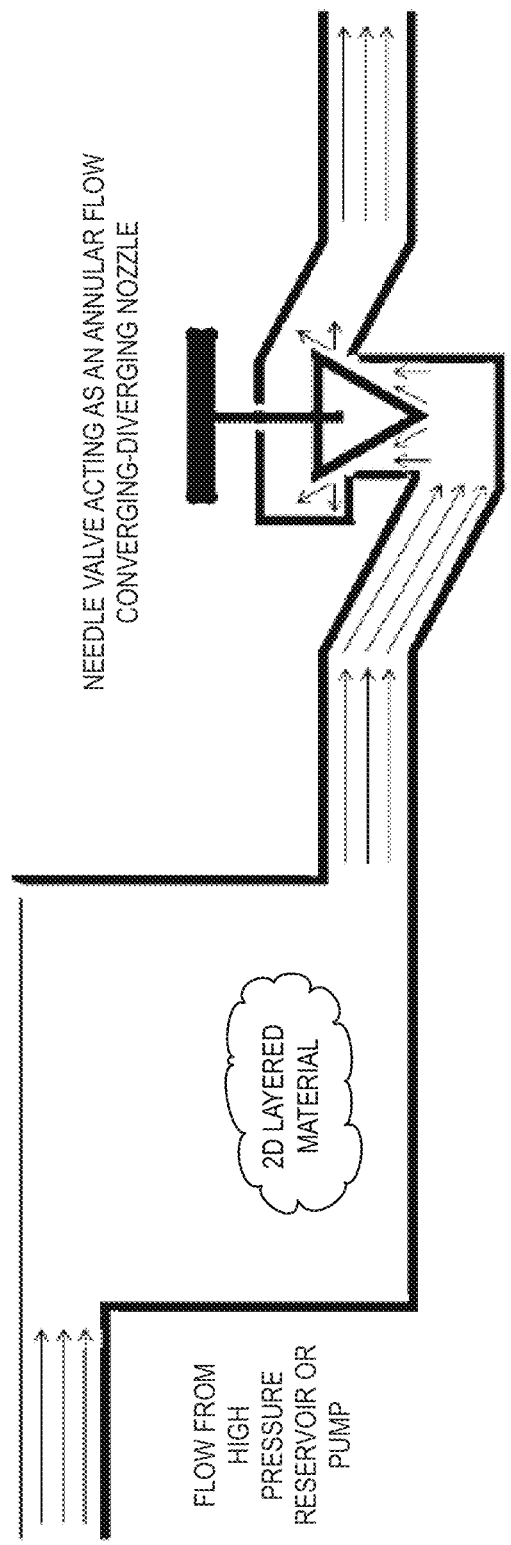
FIG. 5 is a diagram illustrating the internal mechanism of an exemplary vessel valve apparatus for flow compression and expansion.

FIG. 4 shows the setup used to exfoliate 2D layered materials by high-pressure flow compression and expansion. FIG. 5 shows the internal mechanism of the vessel and the valve apparatus that acts as a convergent-divergent nozzle for flow compression and expansion.

Figure 16A:
FIG. 16A displays an image of an exemplary colloidal dispersion of BN processed by high-pressure fluid flow.
Figure 16B:
FIG. 16B displays an image of an exemplary colloidal dispersion of BN in various ethanol controls processed by high-pressure fluid flow.

FIG. 16A shows colloidal dispersions of BN processed by high-pressure fluid flow. FIG. 16B shows colloidal dispersions of BN in various ethanol controls. The single-layer or multi-layer stacking of 2D materials is confirmed by the observation of the Tyndall effect, which is based on the scattering of light by the particles. The BN samples of FIG. 16A processed by flow in order from left to right are (i) pure ethanol; (ii) helium (He) processing, 2000 psi reservoir pressure, 0.1 millimeter (mm) gap of annular orifice; (iii) He processing, 2000 psi reservoir pressure, 0.5 mm gap of annular orifice, and (iv) He processing, 2000 psi reservoir pressure, 6.4 mm channel diameter tube. The control samples of FIG. 16B processed by different competing methods in order from left to right are (i) pure ethanol, (ii) BN in ethanol after He processing overnight, 2000 psi, without any flow (i.e., very slow depressurization), (iii) BN in ethanol with stirring for 3 hours, and (iv) BN in ethanol with sonication for 3 hours.

Figure 17A:
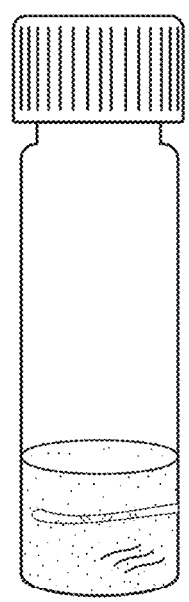
FIG. 17A displays an exemplary image of an exfoliated suspension of BN after centrifugation.
Figure 17B:
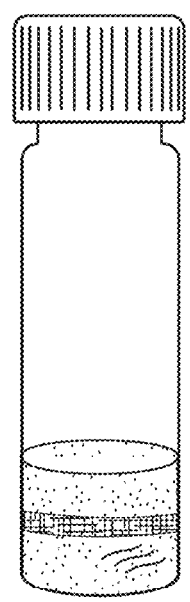
FIG. 17B displays an exemplary image of an exfoliated suspension of graphene after centrifugation.
Figure 17C:
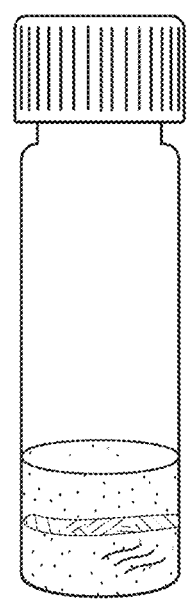
FIG. 17C displays an exemplary image of an exfoliated suspension of molybdenum disulfide after centrifugation.

FIG. 17A to 17C display images of exemplary concentrated solutions of exfoliated 2D layered nanomaterials comprising BN, graphene, and MoS2, respectively. Boron nitride, graphene, and MoS2 are produced using the CFE technique followed by centrifugal separation. Significant light scattering (Tyndall effect) due to nanoparticles in suspension is observed.

In some embodiments, the CFE method comprises bulk 2D layered materials that are suspended in a gas, which passes through a flow compression channel (e.g., a small orifice, converging channel, or thin tube) and then are allowed to expand into ambient conditions. The flow velocity and expansion pressures can be controlled through the appropriate design of an exit channel, such as a carefully designed converging-diverging (de Laval) nozzle. During this process, the gaseous medium achieves supersonic (Mach 1 or greater) velocities, which are necessary to generate the high shear rate environment for 2D particle exfoliation. In a typical CFE experiment, 0.1 to 0.5 g of a 2D layered material is charged in a 50 mL, high-pressure vessel and sealed. The high-pressure fluid, with upstream (stagnant) pressures in the range of 1.4 megapascals (MPa) to 14 MPa (200-2000 psi), is then released into the vessel and the mixture of carrier fluid and 2D material is allowed to flow through a narrow channel or orifice capable of compressing and expanding (accelerating) the gas. A partially open Swagelok needle valve (SS-1KS4, Swagelok Corp.) can be used as an annular-shaped converging-diverging nozzle with an adjustable throat distance. When partially opened (0.25 turns), the valve has an annular orifice gap of 0.1 mm, which is sufficient for exfoliation from parametric studies.

Figure 6:
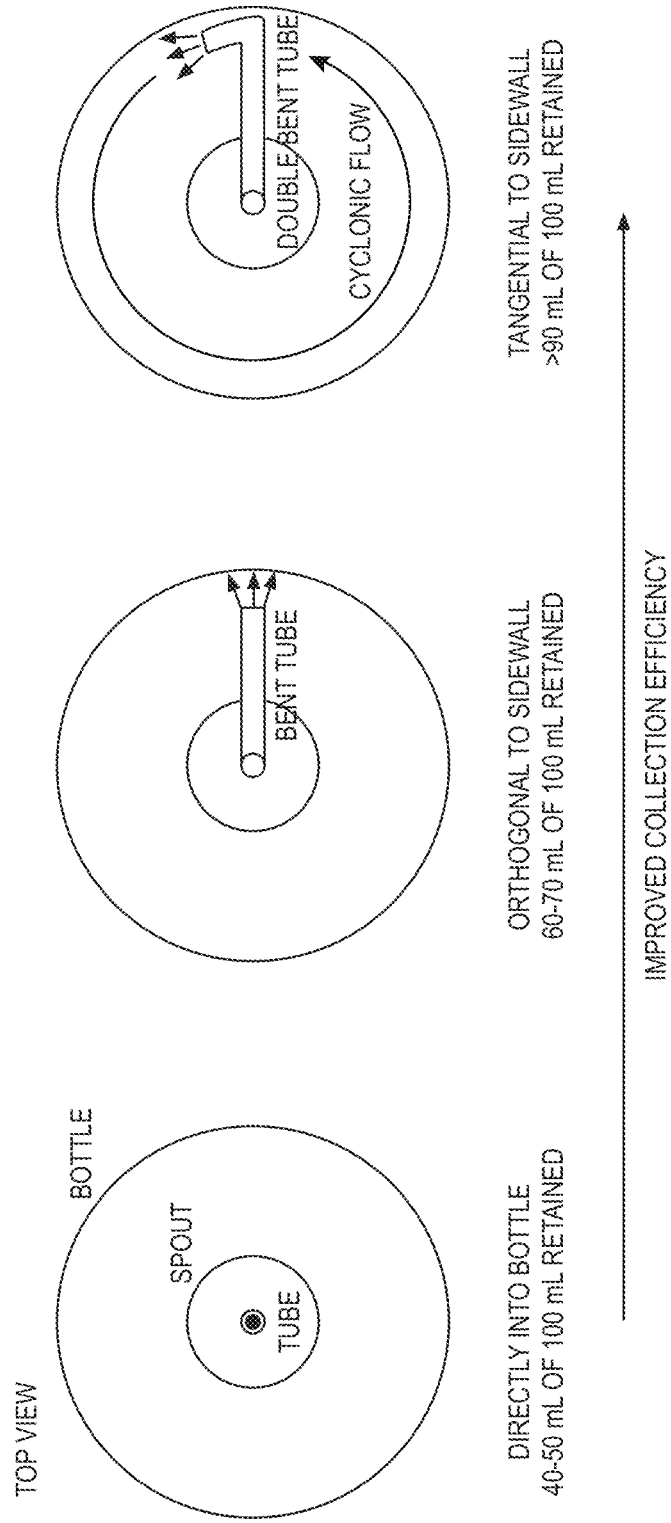
FIG. 6 is a diagram illustrating the configurations and efficiencies of 2D nanomaterial collection apparatuses in a continuous flow exfoliation (CFE) process.
Figure 7A:
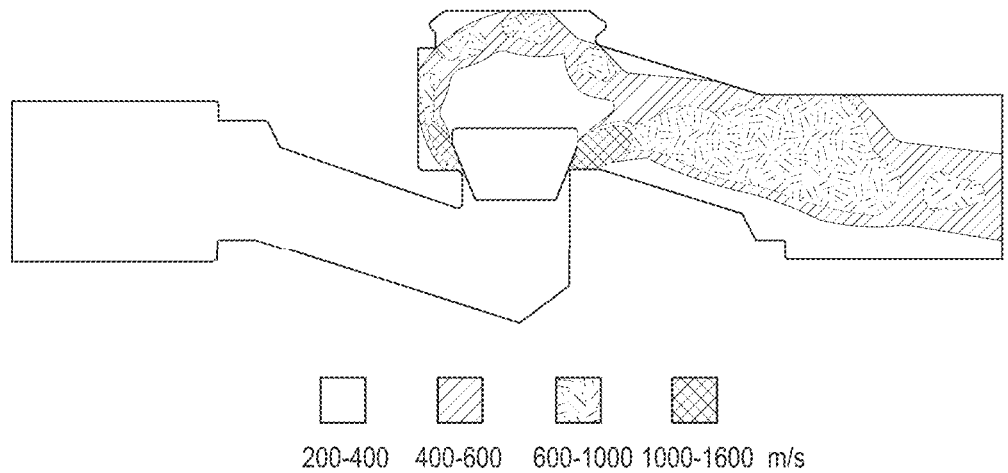
FIG. 7A displays an exemplary computational fluid dynamics (CFD) velocity surface plot in the flow channel.
Figure 7B:
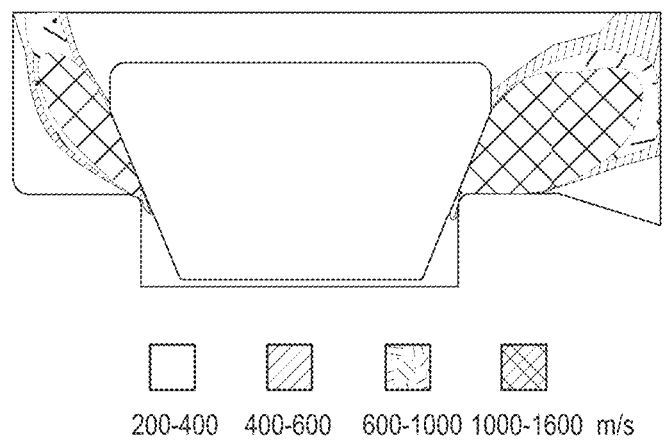
FIG. 7B displays an exemplary CFD detailed velocity surface plot in the annular orifice.

In some embodiments, after passing through the channel, the multiphase jet is vented into a large collection bottle or flask containing 50-100 mL of an appropriate solvent. From prior studies and experience, the appropriate solvents were isopropanol for BN and N-methyl-2-pyrrolidone for graphite and $MoS_2$. The total process lasts only about 2 seconds and can be extended for longer times (e.g., for continuous operation) if there are no concerns for expending the gas or evaporating the solvent. Orientation of the spray nozzle with respect to the collection vessel is critical for maximizing the retention and yield, with the optimum configuration being a cyclonic flow tangential to the vessel walls, per FIG. 6.

In some embodiments, the sprayed solution, containing the 2D layered material, is then centrifuged at high speeds of 1400 rpm (for 90 minutes in order to separate the bulk and multi-layered 2D materials from the single to few-layered 2D nanomaterials (supernatant), which is a commonly employed protocol in top-down 2D material research.

In an experiment, equivalent dispersions of single- to few-layered 2D materials were prepared by liquid phase exfoliation, with and without the assistance of ultrasonication. In some embodiments, 0.1 g of bulk 2D materials was mixed with 100 mL of the appropriate solvent and was bath sonicated for 3 hours. All other handling of the liquid phase exfoliation suspensions, including centrifuging, can be performed by the exact same manner as the continuous flow exfoliation suspensions.

Methods of Characterizing Shear Exfoliated 2D Layered Materials

Figure 18:
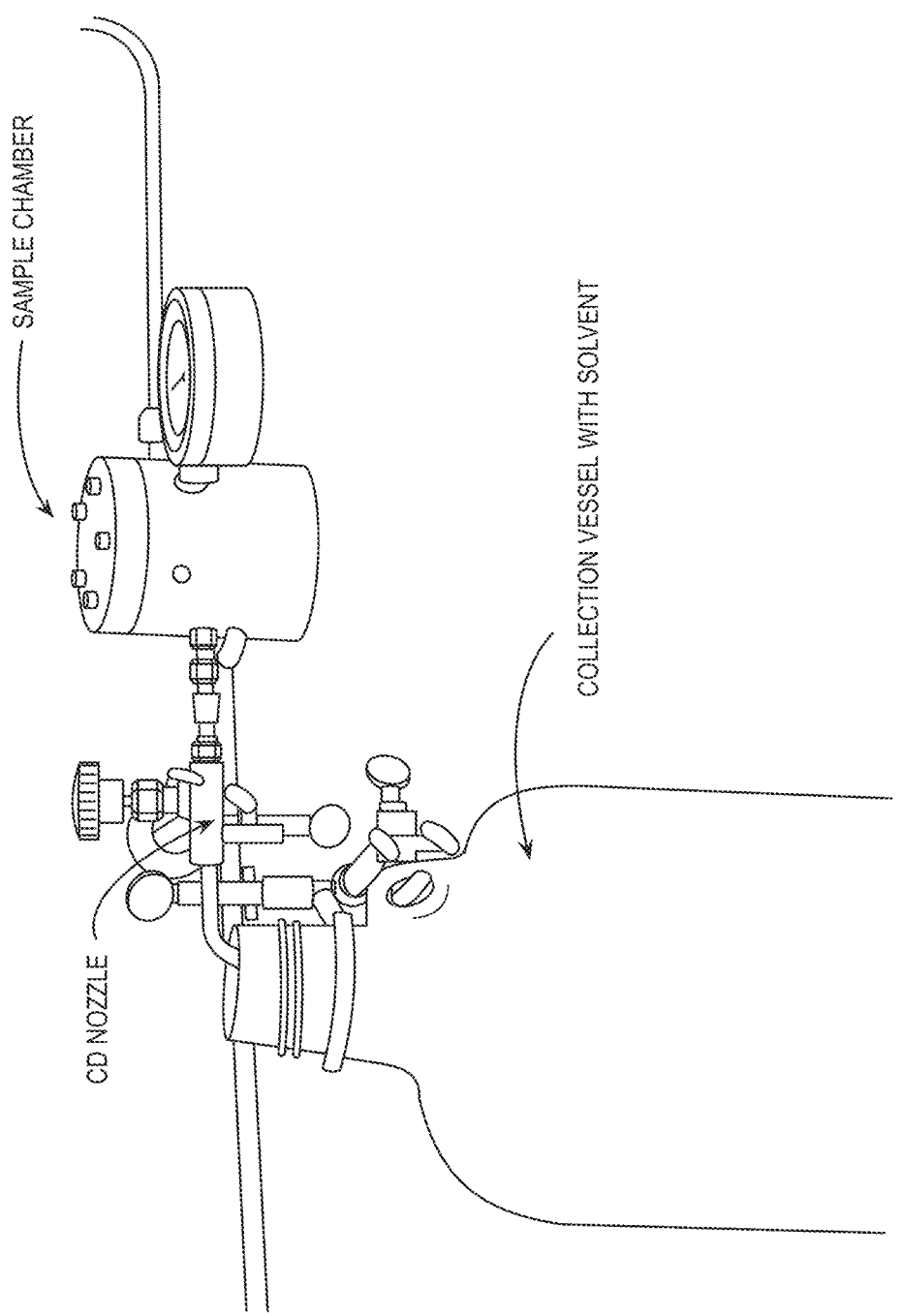
FIG. 18 displays an exemplary apparatus for collecting 2D nanomaterials in a CFE process.

In an experiment, per FIGS. 18, 0.1 to 0.5 g of a 2D layered material was charged in a 50 mL, high-pressure vessel and sealed. The high-pressure fluid, with upstream (stagnant) pressures in the range of 1.4 MPa to 14 MPa exhibits two characteristic peaks; the G peak occurring at 1580 $cm^{-1}$, which is the primary in-plane vibrational mode ($E_{2g}$), and the 2D peak occurring at 2690 $cm^{-1}$. Several differences exist between the Raman spectra of bulk graphite and single-layer graphene, with the most noticeable being (i) the increase in intensity (doubling) of the 2D peak when compared with the G peak, (ii) the red-shifting of the 2D peak, (iii) symmetric ordering of the 2D peak and (iv) the reduction of the full-width half-maximum width of the 2D peak. Although, all of these conditions are necessary to ascertain the presence of mono-layer graphene, they may not all be present when analyzing few-layer graphene or scans of a distribution of graphene with varying layer thicknesses. A comparison of the Raman spectra for both CFE and liquid-phase exfoliation (LPE) processed specimens against the spectrum for bulk graphite indicates two main differences: a significant red-shifting of ~22 $cm^{-1}$ and an increased symmetry of the 2D peak. A narrow symmetric peak is generally exclusive to mono-layer graphene; however, the wide symmetric peak indicates the likely occurrence of AB-stacking disorder (turbostratic graphene) due to re-stacking or folding of sheets. Taken together, these two observations from the Raman spectra indicate, at the very least, a reduction in layer number thickness from bulk graphite powder after being processed by both a continuous CFE process and a batch LPE process.

The absorption at reference wavelengths and the concentrations of the suspensions are computed through the Beer-Lambert law, $$A/l = \alpha C,$$

which states that the light absorption, A, in a medium over a certain distance, l, is proportional to the concentration of the absorbing particles, C. The proportionality term is the extinction co-efficient, $\alpha$, which is specific to a particular 2D layered material, solvent, and wavelength. The conditions of the dispersions mimicked the reference conditions, and hence the wavelength specific extinction co-efficient available in literature could be used for concentration analysis by ultraviolet-visible spectrophotometry (UV-vis). Furthermore, the exact concentrations were measured using gravimetric means and were in good agreement with the concentrations found using UV-vis light scattering (mean error≤5%). Under the same conditions, the method provided herein of CFE achieved concentrations of 0.075, 0.028, and 0.026 mg/mL for BN, graphene, and MoS$_2$, respectively. These values are comparable to, or much better than, the control values obtained using liquid phase exfoliation of 0.004, 0.020, and 0.008 mg/mL for BN, graphene, and MoS$_2$, respectively.

Figures 10A, 10B, 10C, 10D, 10E, 10F:
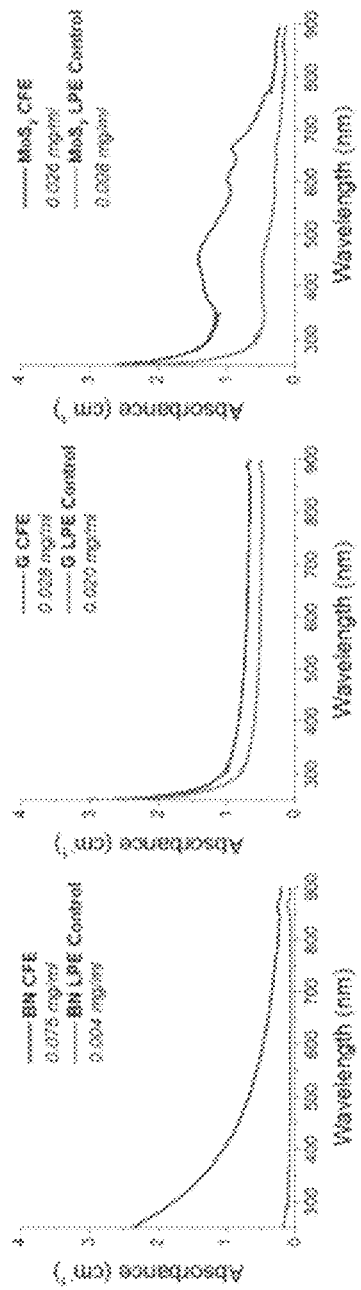
FIG. 10A displays exemplary ultraviolet-visible spectrophotometry (UV-Vis) spectra for suspensions of CFE and liquid-phase exfoliation (LPE) of boron nitride.
FIG. 10B displays exemplary UV-Vis spectra for suspensions of CFE and LPE exfoliation of graphite.
FIG. 10C displays exemplary UV-Vis spectra for suspensions of CFE and LPE exfoliation of molybdenum disulfide.
FIG. 10D displays exemplary Raman spectra for suspensions of CFE and LPE exfoliation of boron nitride.
FIG. 10E displays exemplary Raman spectra for suspensions of CFE and LPE exfoliation of graphite.
FIG. 10F displays exemplary Raman spectra for suspensions of CFE and LPE exfoliation of molybdenum disulfide.

The few-layer nature of the final product after CFE processing and centrifugal separation is evident through Raman spectroscopy analysis of drop cast 2D layer flakes. FIG. 10B illustrates the Raman emission intensity spectra in the relevant bandwidths for BN, whereas FIG. 10E includes the spectra of graphene and MoS$_2$. Comparison of the spectral emissions for all three 2D layered materials suggests layer number reduction compared with reference information available in the literature. The bulk form of BN exhibits a spectrum consisting of one prominent $E_{2g}$ phonon mode emission peak at 1366 cm$^{-1}$. The emission peak undergoes a gradual red-shift to a wave number of 1362-1364 cm$^{-1}$ as the number of layers is reduced to bi-layer or few layer. Finally, when monolayer BN is obtained, its emission peak is significantly blue-shifted to 1369 cm$^{-1}$, which is quite distinct from its bulk emission spectrum. Examination of the acquired Raman spectrum, per FIG. 10D, for BN processed using CFE indicates a significant red-shifting of the peak to 1362 cm$^{-1}$ indicating a significant presence of few-layer and bi-layer BN after processing. In contrast, the LPE processed control did not exhibit significant peak shifting, indicating that a structure still consisting of several layers similar to bulk BN.

The Raman spectrum for bulk graphite, per FIG. 10E, between the wave numbers of 1500-3000 cm$^{-1}$ exhibits two characteristic peaks: the G peak occurring at 1580 cm$^{-1}$, which is the primary in-plane vibrational mode ($E_{2g}$), and the 2D peak occurring at 2690 cm$^{-1}$. Several differences exist between the Raman spectra of bulk graphite and single layer graphene, with the most noticeable being (i) the increase in intensity (doubling) of the 2D peak compared with the G peak, (ii) the red-shifting of the 2D peak, (iii) symmetric ordering of the 2D peak, and (iv) the reduction of the full-width half-maximum width of the 2D peak. Although, all of these conditions are necessary to ascertain the presence of mono-layer graphene, they may not all be present when analyzing few-layer graphene or scans of a distribution of graphene with varying layer thicknesses. A comparison of the Raman spectra for both CFE and LPE processed specimens against the spectrum for bulk graphite indicates two main differences: a significant red-shifting of ~22 cm$^{-1}$ and an increased symmetry of the 2D peak. It should be mentioned that a narrow symmetric peak is exclusive to mono-layer graphene; however, the observation here, of a wide symmetric peak, indicates the likely occurrence of AB-stacking disorder (turbostratic graphene) due to re-stacking or folding of sheets. Taken together, these two observations from the Raman spectra indicate, at the very least, a reduction in layer number thickness from bulk graphite powder after being processed by both continuous CFE process and the batch LPE process.

The spectra for bulk MoS$_2$ before and after CFE and LPE processing are shown in FIG. 10F. Bulk MoS$_2$ exhibits two strong first order peaks: $E^1_{2g}$ and $A_{1g}$, the relative positions of which strongly correlate with the number of layers present. The peak-to-peak wave number distance between the two first-order peaks is approximately 26 cm$^{-1}$ for 633 nanometer (nm) excitation source. Upon subsequent exfoliation to few-layer and to single-layer MoS$_2$, the peak-to-peak distance gradually reduces to as little as 19 cm$^{-1}$. The MoS$_2$ processed using CFE in this study has an $E^1_{2g}$ and $A_{1g}$ peak-to-peak distance of 22.8 cm$^{-1}$, which corresponds with 3-4 layer thickness of the particles. The MoS$_2$ processed using the LPE technique also undergoes layer thickness reduction, albeit with weaker effect, as indicated by a peak-to-peak separation of 24.0 cm$^{-1}$, which corresponds to a layer thickness of 4 or more.

Figure 12A:
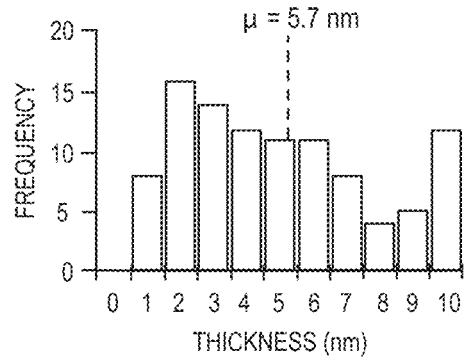
FIG. 12A displays a histogram of the thicknesses of exemplary CFE processed BN under a driving pressure of 5.5 MPa.
Figure 12B:
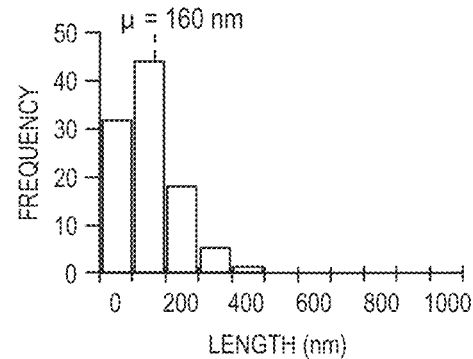
FIG. 12B displays a histogram of the length of exemplary CFE processed BN under a driving pressure of 5.5 MPa.
Figure 12C:
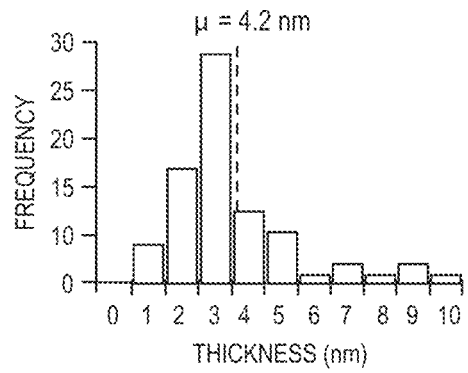
FIG. 12C displays a histogram of the thicknesses of exemplary CFE processed BN under a driving pressure of 10 MPa.
Figure 12D:
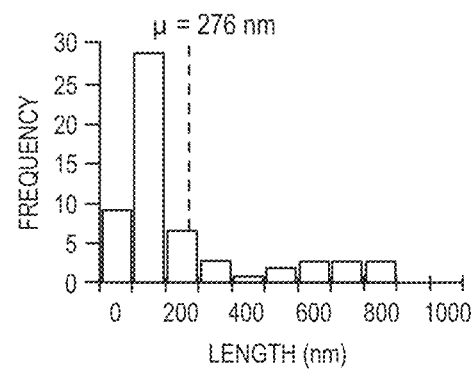
FIG. 12D displays a histogram of the length of exemplary CFE processed BN under a driving pressure of 10 MPa.

The structure of BN nanoparticles was characterized by atomic force microscopy after CFE processing, and a representative flake is shown in FIG. 13A. The exemplary flake has a thickness of 2 nm and a width of 350 nm, giving an aspect ratio of 175. At an interlayer spacing of 0.335 nm, a thickness of 2 nm corresponds to 6 layers of BN that were isolated. Further atomic force microscopy characterization of additional BN particles reveals a distribution of particle thicknesses, per FIG. 13A, and lengths, per FIG. 12D, when subject to the CFE process. Typically, higher driving pressures in CFE result in better flake quality. For instance, BN produced using He gas at 5.5 MPa had an average flake thickness of 5.7 nm and length of 160 nm, per FIGS. 12A and 12B, giving an aspect ratio of 28; whereas at a pressure of 10 MPa the flake thickness and length were 4.2 nm and 276 nm, per FIGS. 12C and 12D, corresponding to an aspect ratio of 66. Furthermore, approximately 27% of the flakes processed at 5.5 MPa had a thickness less than 3.35 nm (corresponding to 10 layers or fewer), and this proportion increases to 43% at the higher pressure of 10 MPa.

Figure 15A:
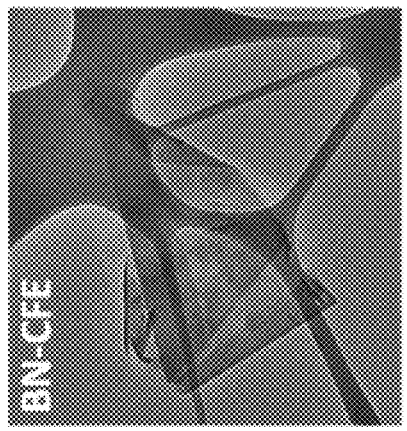
FIG. 15A displays an exemplary TEM image of CFE processed BN.
Figure 15B:
FIG. 15B displays an exemplary TEM image of CFE processed graphene.
Figure 15C:
FIG. 15C displays an exemplary TEM image of CFE processed molybdenum disulfide.
Figure 15D:
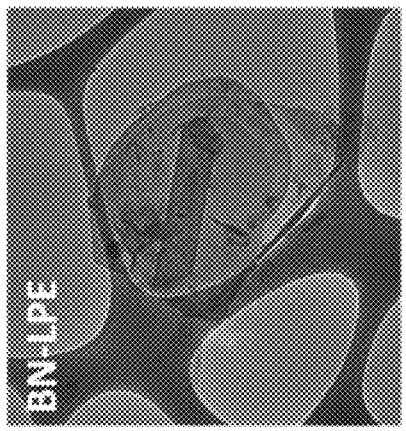
FIG. 15D displays an exemplary TEM image of LPE processed BN.
Figure 15E:
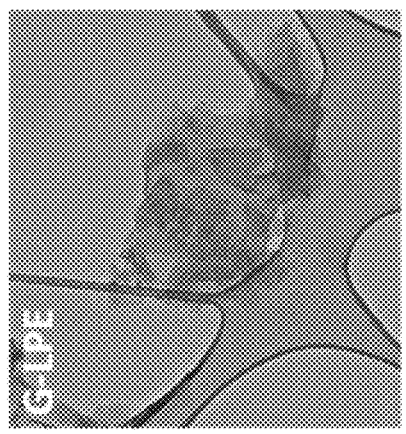
FIG. 15E displays an exemplary TEM image of LPE processed graphene.
Figure 15F:
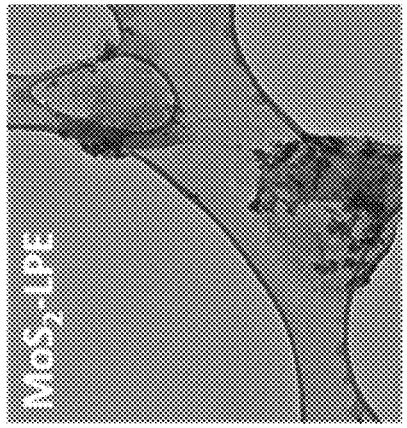
FIG. 15F displays an exemplary TEM image of LPE processed molybdenum disulfide.

The structures of CFE processed BN, graphite, and MoS$_2$, when observed by transmission electron microscopy (TEM) are shown in FIGS. 13B to 13D. The size of these particles typically ranges from 100 nm to 800 nm, indicating a reduction of particle size compared with the starting particle sizes of 13 micrometers for BN and 1 μm for graphite and MoS$_2$. These particles are sufficiently thin, as indicated by their electron-transparency. Furthermore, some flakes appear to be single crystal, while others appear polycrystalline on the basis of their electron diffraction patterns (FIGS. 13B to 13D, insets). The polycrystallinity is indicative of basal plane re-arrangement (turbostraticity), per FIGS. 14A to 14C, and provide further evidence of the Moiré patterns occasionally observed during TEM of BN. Similar Moire imaging projections have been observed during re-stacking of planes when drying from suspension or from the mechanical folding and shifting of individual planes during shear processing. Further TEM images of CFE processed 2D nanomaterials are provided in FIGS. 15A to 15F, along with their LPE counterparts. Clear differences in the shape and surface topology characteristics between the two processes are evident, such as straighter edges in CFE-processed BN, per FIG. 15A, compared with LPE-processed BN, per FIG. 15D, which comprises more rounded out edges. The straighter edges arise from sheet folding or preserved crystalline edge order, both of which are indicative of reduced crystal defects. Edge defects can be detrimental to the thermal and electrical properties of 2D layered materials because they contribute to charge-carrier and phonon scattering. In addition to the reduced edge defects, CFE processed 2D layered materials contain fewer residual particles compared with the LPE processed particles, which can be attributed to the harsher conditions experienced during ultrasonication for extended times in LPE processing. Ultrasonication for long times (hours, days) has been known to cause structural damage, including particle size reduction, of many nanomaterials including carbon nanotubes and 2D layered materials such as graphite, BN, MoS$_2$. The residual particles are quite prominent in the BN and MoS$_2$ particles processed using LPE, per FIGS. 15D and 15F, while their CFE equivalents, per FIGS. 15A and 15C are virtually void of any small-scale residuals.

The material characterization results presented thus far indicate that CFE is equal to or better than the comparable top-down technique of LPE in terms of 2D nanomaterial concentrations, layer thickness, and structural defects. Regarding processing, the advantages of CFE over LPE include rapid/high-throughput processing, the continuous nature of the process, and the use of environmentally friendly gasses instead of handling potentially hazardous solvents in LPE. In contrast to the time-based treatment in ultrasound- and shear-based LPE processes, the CFE process works with a rapid, single pass of the 2D layered materials through a fine nozzle/orifice. Recently, a microfluidization technique that forces surfactant-suspended graphite in an incompressible liquid through a fine orifice at high pressures was shown to be effective at creating 2D nanosheets of graphite. The process required an intensifier pump and multiple passes through the orifice in order to achieve a 100% yield. Although no post-process centrifugation was required, the technique is still time dependent and required the use of surfactants that are detrimental to the interface properties of 2D materials. Similar to several existing top-down processes, both CFE and microfluidization rely on imparting shear forces on the particles to cause layer separation, but to our knowledge CFE is the only process that utilizes the stored potential energy in high-pressure compressed gases to achieve transonic and supersonic velocities that generate the shear required for layer separation while simultaneously utilizing the gas phase for suspending the exfoliated particles during the process.

Figure 11A:
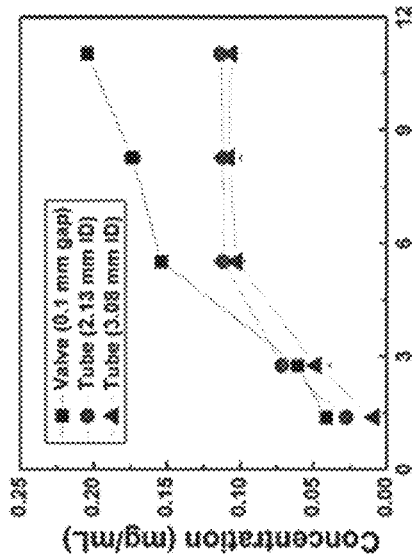
FIG. 11A displays a graph representing an exemplary effect of initial BN concentration on the final BN concentration after CFE.

Per FIGS. 11A to 11D the effect of various process parameters were quantified such as the upstream gas pressure, starting BN amount, process time, gas type, and flow geometry. Initial experiments were done using a Swagelok needle valve partially opened at a quarter turn to create an annular gap of ~0.1 mm along with a converging portion just before the gap and a diverging portion right after the gap, per FIGS. 3A to 3C, and FIG. 5. Other valve settings were experimented with as well, with larger openings giving lower process yields due to insufficient shear, whereas smaller openings resulted in the valve being clogged and the complete restriction of flow. Experiments with flow through constant area stainless steel channels (30 cm length) with varying inner diameters (1.3, 2.1, 3.1, 3.8, and 4.6 mm) were also performed to clarify the role of shear during CFE processing. The effect of starting 2D material powder amount on the final concentration obtained is shown in FIG. 11A. The initial concentration is defined as the amount of BN powder fed into the gas flow divided by the volume of liquid solvent into which it sprays. The final concentration is based on gravimetric measurements after centrifuging and drying. Regardless of the flow geometry (valve or tube), an increase in the initial concentration results in a concomitant rise in the final concentration after only 2 seconds of process run time. However, this effect is limited at higher BN loading amounts, particularly for the valve, where the flow is restricted because of clogging from the highly packed BN powder. The ratio between the final and initial concentrations in FIG. 11A can be interpreted as the yield of the process, which for CFE is between 5% and 10%. This yield is comparable, if not better than most liquid phase processes. However, for context, if this process is run continuously, then the yield can be driven further up through material recovery and re-cycling.

Figure 11B:
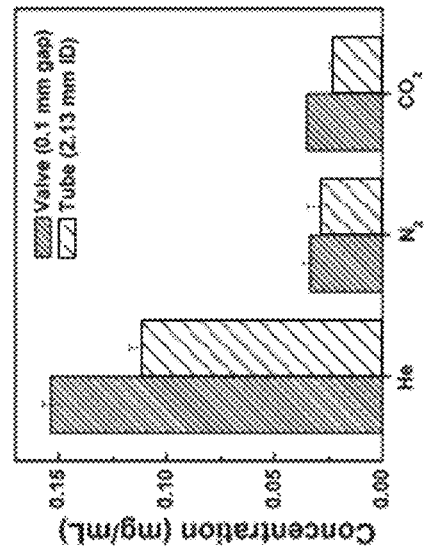
FIG. 11B displays a graph representing an exemplary effect of upstream gas pressure on the final BN concentration after CFE.

The effect of the stagnant upstream pressure on the final concentration is detailed in FIG. 11B. Expansion of the compressed gas, at this stagnant upstream pressure, through a fine orifice is responsible for the high velocities required to shear the suspended 2D layered materials. FIG. 11B shows this effect both for the needle valve, which is a varying geometry configuration, and for straight tubes, which have a constant cross-section. Concentrations of 0.04 mg/mL can be obtained at pressures as low as 1.4 MPa (200 psi), which is within the operating pressures of many consumer-grade air compressors. When BN powder feedstock is forced through a valve, increasing the pressures and resulting in higher BN nanomaterial final concentrations, indicating gradually improved yields in the process. A maximum concentration of 0.2 mg/mL is achieved at the maximum pressure (11 MPa) tested. In contrast, when forced through a straight tube, the final concentration initially rises and then plateaus at 0.11 mg/mL for pressures of 5.5 MPa or more. This plateau behavior at high pressures was observed for all straight-tube configurations, albeit at varying final concentrations.

Figure 11C:
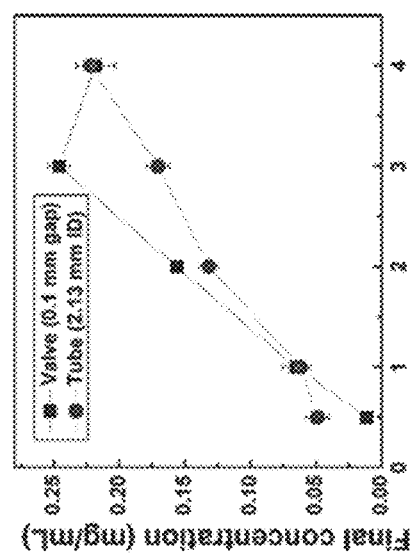
FIG. 11C displays a graph representing an exemplary effect of flow geometry on the final BN concentration after CFE.

The effect of varying inner diameters on the final concentration for the straight tube flow configuration at 5.5 MPa is shown in FIG. 11C. As the tube diameter is increased, there is a rapid increase in the final concentration peaking at 0.11 mg/mL at a diameter of 2.1 mm followed by a gradual decrease. Smaller tube diameters of 0.5 mm and 0.1 mm were also tested, but they significantly impeded the flow at the pressures tested.

Figure 11D:
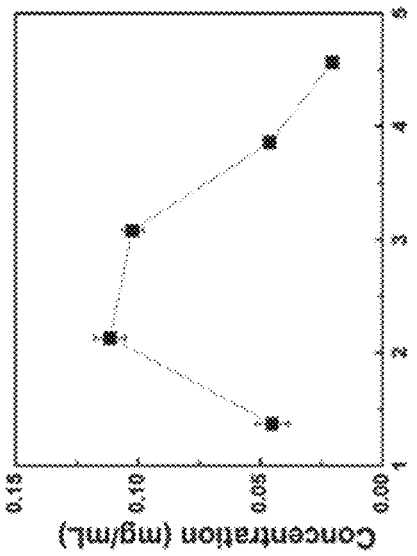
FIG. 11D displays a graph representing an exemplary effect of carrier gas on the final BN concentration after CFE.

The effect of various gases used in CFE is summarized in FIG. 11D. Helium, nitrogen, and carbon dioxide at a common pressure of 5.5 MPa through both valve and straight tube configurations were tested. The final concentrations using helium flowing through the valve were significantly better (0.15 mg/mL) than if nitrogen (0.03 mg/mL) and carbon dioxide (0.03 mg/mL) were used as the carrier gases. A similar trend was observed for the straight tube configuration. Other carrier gases such as argon, a heavier monatomic gas, and compressed air, a gaseous mixture, had results to those of nitrogen and were significantly lower than those obtained using helium.

Within certain pressure differentials, compressible fluids passing through a converging-diverging channel achieve supersonic velocities governed by the following differential relation based on the conservation of mass and momentum:

$$\frac{dV}{V}[M^2 - 1] = \frac{dA}{A}, \quad (1)$$

where dV/V is the fluids relative change in instantaneous velocity (V), dA/A is the relative change in the flow channels instantaneous area, and M is the fluid's Mach number, defined as its velocity V relative to the velocity of the speed of sound, $V_s$. Specifically, the average flow velocity in the narrowest, "throat" portion of the channel (dA/A=0) is equal to the speed of sound in that fluid. Depending on the design of the channel exit (diverging portion), it can achieve even higher velocities (super-sonic) after leaving the throat. This increase in velocity is concomitant with a rapid pressure drop (flow expansion) in the diverging portion of the converging-diverging nozzle. Using this simple picture of supersonic compressible flows and the assistance of computational fluid dynamics, the geometry-specific nature of the flow through a partially open needle valve and the mechanisms responsible for the observed 2D materials exfoliation are examined in detail. computational fluid dynamics simulations were performed in COMSOL Multiphysics v5.3 (High Mach Number—Fluid Physics Model) with the 2D geometry modeled, per FIGS. 3A to 3C, and FIG. 5, using CAD software as per the supplier's dimension proportions of the needle valve. Typical results of flow simulations are shown in FIGS. 7A, 7B, 8A to 8D, 9A, and 9B, which describe the typical case of helium gas at 5.5 MPa flowing through the partially open needle valve (0.1 mm gap). Flow simulations at other pressures are detailed in FIGS. 7A and 7B. The velocity surface plots, per FIG. 7A, demonstrate that the valve acts as an adjustable convergent-divergent nozzle capable of achieving supersonic flows within the pressure range of interest. The speed of sound in helium at room temperature is approximately 1000 meters per second (m/s), which suggests that well-established turbulent flow is occurring. In addition to wall friction, a further contribution to the high shear rates experienced in turbulent flows comes from the sudden, erratic changes in the local velocity profile because of energy dissipation through the stochastic generation of eddies. These changes in velocity over a short span can also give rise to the high shear rates experienced in the centerline of the flow profile, per FIG. 9B. In the straight tube experiments, the channel width is equal to the tube's inner diameter and has a two-part effect in imparting shear on the 2D layered materials and the subsequent final concentration attained. It is evident from FIG. 11C that reducing the tube diameter from a starting value of 4.6 mm tends to improve the final concentration and hence the overall yield of the CFE process. This effect can be explained in terms of shear rate where a reduced tube diameter at the same velocities imparts greater shear rates on the flow because of an increased fraction of the wall (zone of high shear rate) relative to the overall flow cross-section. Almost halving the tube diameter from 4.6 mm to 2.1 mm has the effect of increasing the concentration to 0.11 mg/mL—an improvement by a factor of 5.4. However, further reduction of the tube diameter to 1.3 mm has the unintended effect of severely decreasing the concentration to 0.045 mg/mL. At this diameter, the flow did not achieve the choked condition as per Fanno flow, and it was apparent, audibly, that the exit flow velocities were considerably less than Mach 1. Friction effects tend to dominate at smaller tube diameters, resulting in considerably lower flow velocities and hence shear rates. For instance, changing the tube diameter from 2.1 mm to 1.3 mm for helium flowing at Mach 1 increases the friction factor from 0.028 to 0.035, as per the Moody-Colebrook relationship. Furthermore, the reduced diameter can lower the turbulent nature of the flow.

The effects on the variation of the carrier gas in a CFE processes summarized in FIG. 11D, which shows that final concentration obtained by helium are almost 5 times better than those using nitrogen and carbon dioxide in both straight tube (Fanno flow) and valve (converging-diverging nozzle isentropic flow) configurations. At 293 K, the speed of sound in helium is roughly 1000 m/s, whereas for nitrogen and carbon dioxide, speeds are considerably lower at 350 m/s and 270 m/s, respectively. Provided choked flow (Mach 1) is achieved for these gases, helium being the lighter and faster gas imparts sufficiently higher shear rates than the other heavier gases. Hydrogen gas serves as a better medium for exfoliating 2D layered materials since it is a lighter gas than helium, having a higher speed of sound (1270 m/s) and being more abundant and cost-effective.

Other conditions, representative of the valve experiments in FIG. 11B but at various pressures, were simulated to provide insights into the shear rates developed in supersonic flows through fine orifices; these results are presented in FIGS. 8A to 8D and 9A. It can be seen that the shear rate distribution in the valve evolves as the pressure is increased from 1.4 to 2.8 and 5.5 MPa before finally saturating. At low pressures, areas of high shear ($\dot{\gamma}>10^4$ s$^{-1}$) exist only near the wall in the diverging portion of the converging-diverging nozzle inside the valve. As the upstream pressure driving the flow is doubled to 2.8 MPa, shear rates of $10^5$ s$^{-1}$ or greater are experienced throughout the converging-diverging nozzle. Further doubling of the pressure to 5.5 MPa, per FIG. 8C, results in increase in the area of several completely saturated ($\dot{\gamma}>10^5$ s$^{-1}$) zones of high shear. Any further increase in the pressure does not significantly change the distribution and magnitude of the high shear zones inside the valve. The evolution of the shear zones as predicted by the simulations is directly correlated with the experimentally observed dependence of the final concentration on the upstream pressure, per FIG. 11B. The final concentration more than triples from 0.04 mg/mL to 0.15 mg/mL as the pressure is increased from 1.4 MPa to 5.5 MPa, after which it slowly increases to 0.2 mg/mL at 11 MPa.

It is important to point out that supersonic flows and changing area profiles are not a necessary requirement in CFE. Rather, the shear rate, which is related to the overall flow velocity and the flow channel width, is of considerable importance. The advantage of using gases for shearing 2D layered materials is their inherent compressibility, which can be utilized to accelerate and decelerate from high velocities across short distances, thereby imparting a high shear rate on any suspended solids including 2D materials. Perhaps the most straightforward demonstration of this effect is the straight tube experimental results of FIGS. 11B and 11C. The flow profiles in these experiments are within the consideration of Fanno flow, which describes the adiabatic expansion of a compressible gas inside a constant area duct with a known friction factor. For considerably long ducts, gas expansion during flow causes a maxima in the mass flow rate, and a state of choked flow exists where the flow velocity reaches the speed of sound (Mach 1). Once choked flow is achieved, no further increase in the upstream pressure causes faster velocities. This understanding of Fanno flow correlates well with the observed final concentrations using straight tubes in FIG. 11B and how they become invariant with pressures of 5.5 MPa and higher. Despite the doubling of pressure, velocities faster than the speed of sound are unattainable in these straight tubes, and hence the maximum shear rate and shear rate distribution experienced by the multiphase flow remains unchanged.

Aside from velocity, the shear rate experienced by the flow depends on channel width considerations. Assuming friction effects at the wall (no-slip condition), the shear rate should be highest at the walls and lower at the center of the flow. Complicating this simple explanation is the consideration of turbulent flows, as in the case here, in which analytical expressions of velocity and shear rate profiles are non-existent. The Reynolds number, Re=VD/v—characterizing the laminar-turbulent flow classification based on the fluid's velocity, V, channel diameter, D, and the fluid's kinematic viscosity, v—for the case of helium at Mach 1 through a 2.1 mm channel is 18000, which is well above the turbulent-laminar flow boundary (Re=2300). In addition to wall friction, a further contribution to the high shear rates experienced in turbulent flows comes from the sudden, erratic changes in the local velocity profile because of energy dissipation through the stochastic generation of eddies. These changes in velocity over a short span also give rise to the high shear rates experienced in the centerline of the flow profile, per FIG. 9B. In the straight tube experiments, the channel width is equal to the tube's inner diameter and has a two-part effect in imparting shear on the 2D layered materials and the subsequent final concentration attained. It is evident from FIG. 11C that reducing the tube diameter from a starting value of 4.6 mm tends to improve the final concentration and hence the overall yield of the CFE process. This effect can be explained in terms of shear rate in which a reduced tube diameter at the same velocities imparts greater shear rates on the flow because of an increased fraction of the wall (zone of high shear rate) relative to the overall flow cross-section. Almost halving the tube diameter from 4.6 mm to 2.1 mm has the effect of increasing the concentration to 0.11 mg/mL—an improvement by a factor of 5.4. However, further reduction of the tube diameter to 1.3 mm had the unintended effect of severely decreasing the concentration to 0.045 mg/mL. At this diameter, the flow did not achieve the choked condition as per Fanno flow, and it was apparent, audibly, that the exit flow velocities were considerably less than Mach 1. Friction effects tend to dominate at smaller tube diameters, resulting in considerably lower flow velocities and hence shear rates. For instance changing the tube diameter from 2.1 mm to 1.3 mm for helium flowing at Mach 1 increases the friction factor from 0.028 to 0.035, as per the Moody-Colebrook relationship. Furthermore, the reduced diameter lowers the Re from 18000 to 11000, reducing the turbulent nature of the flow.

The spectra for bulk MoS2 before and after CFE and LPE processing are shown in FIG. 10F. Bulk $MoS_2$ exhibits two strong first-order peaks, $E_{12g}$ and $A_{1g}$, the relative positions of which strongly correlate with the number of layers present. The peak-to-peak wave number distance between the two first-order peaks is approximately 26 $cm^{-1}$ for 633 nm excitation source. Upon subsequent exfoliation to few-layer and to single-layer $MoS_2$, the peak-to-peak distance gradually reduces to as little as 19 $cm^{-1}$. The $MoS_2$ processed using CFE in this study has an $E_{12g}$ and $A_{1g}$ peak-to-peak distance of 22.8 $cm^{-1}$, which according to a detailed description of $MoS_2$ Raman signatures corresponds with 3-4 layer thickness of the particles. The $MoS_2$ processed using the LPE technique also undergoes layer thickness reduction, albeit with weaker effect, as indicated by a peak-to-peak separation of 24.0 $cm^{-1}$, which corresponds to a layer thickness of 4 or more layers.

The method provided herein of CFE is effective at creating very fine colloidal suspensions of various 2D layered materials. Some sampled sprayed dispersions after centrifugation are shown in FIG. 17C for the 2D layered materials BN, graphite, and $MoS_2$. All solutions were processed using CFE with helium at 14 MPa as the carrier gas flowing through a 0.1 mm annular orifice (Swagelok valve), although other flow geometries, gases, and pressures conditions are possible and are detailed subsequently. The CFE process was able to achieve high concentrations of colloidal 2D layered particles after the centrifugation process as indicated by the extensive laser light (Tyndall) scattering through the solution. UV-Vis light scattering profiles for BN, graphite, and $MoS_2$ are shown in FIGS. 10A, 10B, and 10C, respectively, showing that suspensions created through the CFE process were able to absorb significantly more light across a wide spectrum of wavelengths compared with an equivalent LPE control method. It is important to note that the results of both techniques, CFE and LPE, are reported here without the use of surfactants or other surface energy-modifying chemistries, which could result in higher concentrations but at the expense of deteriorating 2D material interface properties.

Three types of 2D layered materials were used to investigate the CFE method. The first was natural graphite flake, an electrically conductive layered material, provided by Sigma Aldrich (Milwaukee, Wis.), which had a reported powder size of 1-2 µm. Second, $MoS_2$, a transition metal dichalcogenide with topologically insulating characteristics, was purchased from Alfa Aesar (Milwaukee, Wis.), which had a reported powder size of 1 µm. Finally, hexagonal BN, an insulating layered compound, was provided by Momentive (Waterford, N.Y.), which had a reported size of 13 µm.

Terms and Definitions

For the purpose of this disclosure, a 2D layered material is defined as a material characterized by weak non-covalent bonds in the c-axis.

For the purpose of this disclosure, a convergent-divergent nozzle is a tube comprising an inlet and an outlet that is pinched in the middle to form a throat, making a carefully balanced, asymmetric hourglass shape. It is used to accelerate a hot, pressurized gas passing through it to a higher supersonic speed in the axial (thrust) direction, by converting the heat energy of the flow into kinetic energy.

For the purpose of this disclosure, centrifuging comprises rotating an object around a fixed axis (spins it in a circle), applying a potentially strong force perpendicular to the axis of spin (outward) that can be used to filter a fluid.

As used herein, and unless otherwise defined, the term "about" refers to a range of values within plus and/or minus 10% of the specified value.

As used herein, and unless otherwise defined, the term "thin tube" refers to a tube, capable of enabling turbulent flow of the layered material and the compressible fluid, at a Reynolds number of above 2300.

Alternative Embodiments

An embodiment provided herein is a method for continuous production of exfoliated two-dimensional (2D) material comprising providing a 2D material mixture that includes passing a 2D layered material and a compressible fluid; compressing a continuous flow of the 2D material mixture; and expanding the continuous flow of the 2D mixture to exfoliate the 2D layered material through a convergent-divergent nozzle.

In some embodiments, the method results in the continuous flow of the 2D material mixture being under a pressure of between 200 pounds per square inch (psi) and 2000 psi. In some embodiments, compressing results in the continuous flow of the 2D material mixture being under a pressure of between 200 psi and 1100 psi. In some embodiments, compressing results in the continuous flow of the 2D material mixture being under a pressure of between 1100 psi and 2000 psi. In some embodiments, expanding results in the continuous flow of 2D material mixture reaching a supersonic speed. In some embodiments, the continuous flow of the 2D material is passed through a converging-diverging channel. In the method for continuous production of exfoliated 2D material the continuous flow of the 2D material flows at a subsonic speed while passing within a converging portion the converging-diverging channel and flows at a supersonic speed while passing within a diverging portion of the converging-diverging channel. In the method for continuous production of exfoliated 2D material the 2D layered material is exfoliated within a throat of the converging-diverging channel. In the method for continuous production of exfoliated 2D material the converging-diverging channel is a de Laval nozzle. In some embodiments, the 2D layered material is graphite. In the method for continuous production of exfoliated 2D material the exfoliated 2D material is graphene. In some embodiments, the 2D layered material is boron nitride. In the method for continuous production of exfoliated 2D material the exfoliated 2D material is single-layer boron nitride. In some embodiments, the 2D layered material is molybdenum disulfide ($MoS_2$). In the method for continuous production of exfoliated 2D material the exfoliated 2D material is single-layer $MoS_2$. In some embodiments, the 2D layered material is characterized by weak non-covalent bonds in the c-axis. In some embodiments, the compressible fluid is air. In some embodiments, the compressible fluid is nitrogen. In some embodiments, the compressible fluid is carbon dioxide. In some embodiments, the compressible fluid is helium. In some embodiments, the method further comprises collecting the exfoliated 2D material in a solvent.

The invention claimed is:

1. A method for continuous production of an exfoliated two-dimensional (2D) material comprising passing a 2D material in a compressible fluid through a convergent-divergent nozzle to exfoliate the 2D material before the 2D material intercalates.

2. The method of claim 1, wherein the 2D material comprises boron nitride (BN).

3. The method of claim 1, wherein the 2D material comprises graphite, graphene, single-layer BN, molybdenum disulfide (MoS2), single-layer MoS2, or any combination thereof.

4. The method of claim 1, wherein the compressible fluid comprises air, nitrogen, carbon dioxide, helium, or any combination thereof.

5. The method of claim 1, wherein a concentration of the 2D material in the compressible fluid is about 0.01 milligram per milliliter (mg/mL) to about 0.4 mg/mL.

6. The method of claim 1, wherein the convergent-divergent nozzle comprises a de Laval nozzle, a valve, an orifice, a thin tube, or any combination thereof.

7. The method of claim 5, wherein a valve of the convergent-divergent nozzle comprises a needle valve, a butterfly valve, a globe valve, a pinch valve, an adjustable flow valve, a one-way flow valve, or any combination thereof.

8. The method of claim 1, wherein the 2D material in the compressible fluid is passed through the convergent-divergent nozzle at a pressure of about 200 pounds per square inch (psi) to about 4000 psi.

9. The method of claim 1, wherein the 2D material in the compressible fluid enters the convergent-divergent nozzle at a velocity less than the speed of sound in the compressible fluid.

10. The method of claim 1, wherein the 2D material in the compressible fluid exits the convergent-divergent nozzle at a velocity greater than the speed of sound in the compressible fluid.

11. The method of claim 1, wherein the convergent-divergent nozzle has a throat dimension of about 0.005 millimeter (mm) to about 0.5 mm.

12. The method of claim 1, wherein the convergent-divergent nozzle has an inlet or an outlet dimension of about 3 mm to about 10 mm.

13. The method of claim 1, wherein the convergent-divergent nozzle has a length of about 15 centimeters (cm) to about 60 cm.

14. The method of claim 1, wherein the convergent-divergent nozzle has at least one of a throat-to-inlet dimension ratio and a throat-to-outlet dimension ratio of about 15 to about 60.

15. The method of claim 1, wherein a percent of the 2D material that produces the exfoliated 2D material is about 50% to about 100%.

16. The method of claim 1, wherein the exfoliated 2D material comprises a plurality of flakes with an aspect ratio of about 10 to about 300.

17. The method of claim 1, wherein the exfoliated 2D material comprises a plurality of flakes with an average thickness of about 0.35 nanometer (nm) to about 10 nm.

18. The method of claim 1, wherein the exfoliated 2D material comprises a plurality of flakes with an average length of about 50 nm to about 1,600 nm.

19. The method of claim 1, wherein the exfoliated 2D material comprises a plurality of flakes comprising at most about 20 layers.

20. The method of claim 1, further comprising centrifuging the exfoliated 2D material.

* * * * *